United States Patent [19]
Keeth et al.

[11] Patent Number: 6,101,197
[45] Date of Patent: Aug. 8, 2000

[54] METHOD AND APPARATUS FOR ADJUSTING THE TIMING OF SIGNALS OVER FINE AND COARSE RANGES

[75] Inventors: Brent Keeth, Boise; Troy A. Manning, Meridian, both of Id.

[73] Assignee: Micron Technology, Inc., Boise, Id.

[21] Appl. No.: 08/933,324

[22] Filed: Sep. 18, 1997

[51] Int. Cl.⁷ .................................................. H04J 3/06
[52] U.S. Cl. ......................... 370/517; 370/516; 370/503; 375/371
[58] Field of Search ................................ 370/517, 516, 370/509, 503, 464, 465, 518, 351, 352, 354; 375/354, 362, 371, 372–376

[56] References Cited

U.S. PATENT DOCUMENTS

| | | | |
|---|---|---|---|
| 4,077,016 | 2/1978 | Sanders et al. | 331/4 |
| 4,096,402 | 6/1978 | Schroeder et al. | 307/362 |
| 4,404,474 | 9/1983 | Dingwall | 307/260 |

(List continued on next page.)

FOREIGN PATENT DOCUMENTS

| | | |
|---|---|---|
| 0 295 515 A1 | 12/1988 | European Pat. Off. . |
| 0 406 786 A1 | 1/1991 | European Pat. Off. . |
| 0 450 871 A2 | 10/1991 | European Pat. Off. . |
| 0 476 585 A2 | 3/1992 | European Pat. Off. . |
| 0 655 741 A2 | 5/1995 | European Pat. Off. . |
| 0 680 049 A2 | 11/1995 | European Pat. Off. . |
| 0 704 848 A2 | 4/1996 | European Pat. Off. . |
| 0 704 957 A1 | 4/1996 | European Pat. Off. . |
| 0 767 538 A1 | 4/1997 | European Pat. Off. . |
| 2-112317 | 4/1990 | Japan . |
| 4-135311 | 8/1992 | Japan . |
| 5-136664 | 1/1993 | Japan . |
| 5-282868 | 10/1993 | Japan . |
| WO 94/29871 | 12/1994 | WIPO .............................. G11C 7/00 |
| WO 95/22200 | 8/1995 | WIPO ............................ H03H 11/20 |
| WO 95/22206 | 8/1995 | WIPO ............................ H03L 7/081 |
| WO 96/10866 | 4/1996 | WIPO . |
| WO 97/14289 | 4/1997 | WIPO . |
| WO 97/42557 | 11/1997 | WIPO . |

OTHER PUBLICATIONS

Anonymous, "Programmable Pulse Generator", IBM Technical Disclosure Bulletin, vol. 17, No. 12, May 1975, pp. 3553–3554.

Anonymous, "Pulse Combining Network", IBM Technical Disclosure Bulletin, vol. 32, No. 12, May 1990, pp. 149–151.

Hamamoto, T., "400–MHz Random Column Operating SDRAM Techniques with Self–Skew Compensation," IEEE Journal of Solid–State Circuits, vol. 33, No. 5, May 1998, pp. 770–778.

(List continued on next page.)

*Primary Examiner*—Ajit Patel
*Assistant Examiner*—Ricardo M. Pizarro
*Attorney, Agent, or Firm*—Dorsey & Whitney LLP

[57] ABSTRACT

A variable delay circuit is formed by a fine delay circuit and a coarse delay circuit. The fine delay circuit adjusts the delay of a delayed clock signal in relatively small phase increments with respect to an input clock signal. The coarse delay circuit adjusts the timing of a digital signal in relatively large phase increments. The delayed clock signal is used to clock a register to which the digital signal is applied to control the timing a the digital signal clocked through the register responsive to adjusting the timing of the fine delay circuit and the coarse delay circuit. The timing relationship is initially adjusted by altering the delay of the fine delay circuit. Whenever the maximum or minimum delay of the fine delay circuit is reached, the coarse delay circuit is adjusted. The variable delay circuit may be used in a memory device to control the timing at which read data is applied to the data bus of the memory device. The fine delay circuit includes a multi—tapped delay line coupled to a multiplexer that selects one of the taps for use in generating the delayed clock. When the first or last tap is selected, the timing of the coarse delay circuit is adjusted. The coarse delay circuit includes a counter that generates the digital signal upon counting from an initial count to the terminal count. The coarse delay circuit is adjusted by adjusting the initial count of the counter.

54 Claims, 14 Drawing Sheets

U.S. PATENT DOCUMENTS

| | | | |
|---|---|---|---|
| 4,481,625 | 11/1984 | Roberts et al. | 370/85 |
| 4,511,846 | 4/1985 | Nagy et al. | 328/164 |
| 4,514,647 | 4/1985 | Shoji | 307/269 |
| 4,638,187 | 1/1987 | Boler et al. | 307/451 |
| 4,687,951 | 8/1987 | McElroy | 307/269 |
| 4,773,085 | 9/1988 | Cordell | 375/120 |
| 4,789,796 | 12/1988 | Foss | 307/443 |
| 4,893,087 | 1/1990 | Davis | 328/14 |
| 4,902,986 | 2/1990 | Lesmeister | 331/25 |
| 4,958,088 | 9/1990 | Farah-Bakhsh et al. | 307/443 |
| 4,984,204 | 1/1991 | Sato et al. | 365/189.11 |
| 5,020,023 | 5/1991 | Smith | 364/900 |
| 5,038,115 | 8/1991 | Myers et al. | 331/2 |
| 5,086,500 | 2/1992 | Greub | 395/550 |
| 5,087,828 | 2/1992 | Sato et al. | 307/269 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,046 | 11/1992 | Hessen | 307/270 |
| 5,179,298 | 1/1993 | Hirano et al. | 307/443 |
| 5,194,765 | 3/1993 | Dunlop et al. | 307/443 |
| 5,212,601 | 5/1993 | Wilson | 360/51 |
| 5,220,208 | 6/1993 | Schenck | 307/443 |
| 5,239,206 | 8/1993 | Yanai | 307/272.2 |
| 5,243,703 | 9/1993 | Farmwald et al. | 395/325 |
| 5,254,883 | 10/1993 | Horowitz et al. | 307/443 |
| 5,256,989 | 10/1993 | Parker et al. | 331/1 A |
| 5,257,294 | 10/1993 | Pinto et al. | 375/120 |
| 5,268,639 | 12/1993 | Gasbarro et al. | 324/158 R |
| 5,274,276 | 12/1993 | Casper et al. | 307/443 |
| 5,276,642 | 1/1994 | Lee | 365/189.04 |
| 5,278,460 | 1/1994 | Casper | 307/296.5 |
| 5,281,865 | 1/1994 | Yamashita et al. | 307/279 |
| 5,283,631 | 2/1994 | Koerner et al. | 307/451 |
| 5,295,164 | 3/1994 | Yamamura | 375/120 |
| 5,311,481 | 5/1994 | Casper et al. | 365/230.06 |
| 5,311,483 | 5/1994 | Takasugi | 365/233 |
| 5,321,368 | 6/1994 | Hoelzle | 328/63 |
| 5,337,285 | 8/1994 | Ware et al. | 365/227 |
| 5,347,177 | 9/1994 | Lipp | 307/443 |
| 5,347,179 | 9/1994 | Casper et al. | 307/451 |
| 5,355,391 | 10/1994 | Horowitz et al. | 375/36 |
| 5,361,002 | 11/1994 | Casper | 327/530 |
| 5,390,308 | 2/1995 | Ware et al. | 395/400 |
| 5,400,283 | 3/1995 | Raad | 365/203 |
| 5,408,640 | 4/1995 | MacIntyre et al. | 395/550 |
| 5,410,263 | 4/1995 | Waizman | 327/141 |
| 5,420,544 | 5/1995 | Ishibashi | 331/11 |
| 5,428,311 | 6/1995 | McClure | 327/276 |
| 5,430,676 | 7/1995 | Ware et al. | 365/189.02 |
| 5,432,823 | 7/1995 | Gasbarro et al. | 375/356 |
| 5,438,545 | 8/1995 | Sim | 365/189.05 |
| 5,440,260 | 8/1995 | Hayashi et al. | 327/278 |
| 5,440,514 | 8/1995 | Flannagan et al. | 365/194 |
| 5,446,696 | 8/1995 | Ware et al. | 365/222 |
| 5,448,193 | 9/1995 | Baumert et al. | 327/156 |
| 5,451,898 | 9/1995 | Johnson | 327/563 |
| 5,457,407 | 10/1995 | Shu et al. | 326/30 |
| 5,465,076 | 11/1995 | Yamauchi et al. | 331/179 |
| 5,473,274 | 12/1995 | Reilly et al. | 327/159 |
| 5,473,575 | 12/1995 | Farmwald et al. | 365/230.06 |
| 5,473,639 | 12/1995 | Lee et al. | 375/376 |
| 5,485,490 | 1/1996 | Leung et al. | 375/371 |
| 5,488,321 | 1/1996 | Johnson | 327/66 |
| 5,489,864 | 2/1996 | Ashuri | 327/161 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farmwald et al. | 395/309 |
| 5,539,345 | 7/1996 | Hawkins | 327/150 |
| 5,544,203 | 8/1996 | Casasanta et al. | 375/376 |
| 5,552,727 | 9/1996 | Nakao | 327/159 |
| 5,568,075 | 10/1996 | Curran et al. | 327/172 |
| 5,568,077 | 10/1996 | Sato et al. | 327/199 |
| 5,572,557 | 11/1996 | Aoki | 375/376 |
| 5,574,698 | 11/1996 | Raad | 365/230.06 |
| 5,576,645 | 11/1996 | Farwell | 327/94 |
| 5,577,236 | 11/1996 | Johnson et al. | 395/551 |
| 5,578,940 | 11/1996 | Dillon et al. | 326/30 |
| 5,578,941 | 11/1996 | Sher et al. | 326/34 |
| 5,581,197 | 12/1996 | Motley et al. | 326/30 |
| 5,589,788 | 12/1996 | Goto | 327/276 |
| 5,590,073 | 12/1996 | Arakawa et al. | 365/185.08 |
| 5,614,855 | 3/1997 | Lee et al. | 327/158 |
| 5,619,473 | 4/1997 | Hotta | 365/238.5 |
| 5,621,340 | 4/1997 | Lee et al. | 327/65 |
| 5,621,690 | 4/1997 | Jungroth et al. | 365/200 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,657,481 | 8/1997 | Farmwald et al. | 395/551 |
| 5,668,763 | 9/1997 | Fujioka et al. | 365/200 |
| 5,692,165 | 11/1997 | Jeddeloh et al. | 395/551 |
| 5,694,065 | 12/1997 | Hamasaki et al. | 327/108 |
| 5,712,580 | 1/1998 | Baumgartner et al. | 327/12 |
| 5,751,665 | 5/1998 | Tanoi | 368/120 |

OTHER PUBLICATIONS

Taguchi, M. et al., "A 40–ns 64–Mb DRAM with 64–b Parallel Data Bus Architecture", IEEE Journal of Solid–State Circuits, vol. 26, Nov. 1991, pp. 1493–1497.

Alvarez, J. et al. "A Wide–Bandwidth Low Voltage PLL for PowerPC ™Microprocessors" IEEE IEICE Trans. Electron., vol. E–78. No. 6, Jun. 1995, pp. 631–639.

Aviram, A. et al., "Obtaining High Speed Printing On Thermal Sensitive Special Paper With A Resistive Ribbon Print Head", IBM Technical Disclosure Bulletin, vol. 27, No. 5, Oct. 1984, pp. 3059–3060.

Chapman, J. et al., "A Low–Cost High–Performance CMOS Timing Vernier for ATE", IEEE International Test Conference, Paper 21.2, 1995, pp. 459–468.

Cho, J. "Digitally–Controlled PLL with Pulse Width Detection Mechanism for Error Correction", ISSCC 1997, Paper No. SA 20.3, pp. 334–335.

Christiansen, J., "An Integrated High Resolution CMOS Timing Generator Based on an Array of Delay Locked Loops", IEEE Journal of Solid–State Circuits, vol. 31, No. 7, July 1996, pp. 952–957.

Combes, M. et al., "A Portable Clock Multiplier Generator Using Digital CMOS Standard Cells", IEEE Journal of Solid–State Circuits, vol. 31, No. 7, July 1996, pp. 958–965.

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

Goto, J. et al., "A PLL–Based Programmable Clock Generator with 50–to 350–MHz Oscillating Range for Video Signal Processors", IEICE Trans. Electron., vol. E77–C, No. 12, Dec. 1994, pp. 1951–1956.

Ishibashi, A. et al., "High–Speed Clock Distribution Architecture Employing PLL for 0.6μ CMOS Sog", IEEE Custon Integrated Circuits Conference, 1992, pp. 27.6.1–27.6.4

Kim, B. et al., "A 30MHz High–Speed Analog/Digital PLL in 2μ CMOS", ISSCC, February 1990.

Kikuchi, S. et al., "A Gate–Array–Based 666Mhz VLSI Test System", IEEE International Test Conference, Paper 21.1, 1995, pp. 451–458.

Ko, U. et al., "A 30–ps Jitter, 3.6–μ Locking, 3.3–Volt Digital PLL For CMOS Gate Arrays", IEEE Custom Integrated Circuits Conference, 1993, pp. 23.3.1–23.3.4.

Lee, T. et al., "A 2.5V Delay–Locked Loop for an 18Mb 500MB/s DRAM", IEEE International Solid–State Circuits Conference Digest of Technical Papers, Paper No. FA 18.6, 1994, pp. 300–301.

Lesmeister, G., "A Densely Integrated High Performance CMOS Tester", International Test Conference, Paper 16.2, 1991, pp. 426–429.

Ljuslin, C. et al., "An Integrated 16–channel CMOS Time to Digital Converter", IEEE Nuclear Science Symposium & Medical Imaging Conference Record, vol. 1, 1993, pp. 625–629.

Maneatis, J., "Low–Jitter Process–Independent DLL and PLL Based on Self–Biased Techniques", IEEE Journal of Solid–State Circuits, vol. 31, No. 11, Nov. 1996, pp. 1723–1732.

Nakamura, M. et al., "A 156 Mbps CMOS Clock Recovery Circuit for Burst–mode Transmission", Symposium on VLSI Circuits Digest of Technical Papers, 1996, pp. 122–123.

Nielson, E., "Inverting latches make simple VCO", EDN, June 19, 1997.

Novof, I. et al., "Fully Integrated CMOS Phase–Locked Loop with 15 to 240 MHz Locking Range and ±50 ps Jitter", IEEE Journal of Solid–State Circuits, vol. 30, No. 11, Nov. 1995, pp. 1259–1266.

Santos, D. et al., "A CMOS Delay Locked Loop and Sub–Nanosecond Time–to–Digital Converter Chip", IEEE Nuclear Science Symposium and Medical Imaging Conference Record, vol. 1, Oct. 1995, pp. 289–291.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

Shirotori, T. et al., "PLL–based, Impedance Controlled Output Buffer", 1991 Symposium on VLSI Circuits Digest of Technical Papers, pp. 49–50.

Descriptive literature entitled, "400MHz SLDRAM, 4M X 16 SLDRAM Pipelined, Eight Bank, 2.2 V Operation," SLDRAM Consortium Advance Sheet, published throughout the United States, pp. 1–22.

Sidiropoulos, S et al., "A 700–Mb/s/pin CMOS Signaling Interface Using Current Integrating Receivers", IEEE Journal of Solid–State Circuits, vol. 32, No. 5, May 1997, pp. 681–690.

Sidiropoulos, S. et al., "A CMOS 500 Mbps/pin synchronous point to point link interface", IEEE Symposium on VLSI Circuits Digest of Technical Papers, 1994, pp. 43–44.

Sidiropoulos, S et al., "A Semi–Digital DLL with Unlimited Phase Shift Capability and 0.08–400MHz Operating Range," in 1997 IEEE International Solid State Circuits Conference, Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Tanoi, S. et al., "A 250–622 MHz Deskew and Jitter–Suppressed Clock Buffer Using a Frequency–and Delay–Locked Two–Loop Architecture", 1995 Symposium on VLSI Circuits Digest of Technical Papers, vol. 11, No. 2, pp. 85–86.

Tanoi, S. et al., "A 250–622 MHz Deskew and Jitter–Suppressed Clock Buffer Using Two–Loop Architecture", IEEE IEICE Trans. Electron., vol. E–79–C. No. 7, July 1996, pp. 898–904.

von Kaenel, V. et al., "A 320 MHz, 1.5 mW V CMOS PLL for Microprocessor Clock Generation", IEEE Journal of Solid–State Circuits, vol. 31, No. 11, Nov. 1996, pp. 1715–1722.

Watson, R. et al., "Clock Buffer Chip with Absolute Delay Regulation Over Process and Environmental Variations", IEEE Custom Intergrated Circuits Conference, 1992, pp. 25.2.1–25.2.5.

Yoshimura, T. et al., "A 622–Mbps CMOS Clock Recovery Circuit for Burst–Mode Transmission", Symposium on VLSI Circuits Digest of Technical Papers, 1996, pp. 122–123.

Yoshimura, T. et al., "A 622–Mb/s Bit/Frame Synchronizer for High–Speed Backplane Data Communication", IEEE Journal of Solid–State Circuits, vol. 31, No. 7, Jul. 1996, pp. 1063–1066.

Arai, Y. et al., "A CMOS Four Channel x 1K Time Memory LSI with 1–ns/b Resolution", IEEE Journal of Solid–State Circuits, vol. 27, No. 3,M, 8107 Mar., 1992, No.3, New York, US.

Arai, Y. et al., "A Time Digitizer CMOS Gate–Array with a 250 ps Time Resolution", XP 000597207, IEEE Journal of Solid–State Circuits, vol. 31, No.2 Feb. 1996.

Bazes, M., "Two Novel Fully Complementary Self–Biased CMOS Differential Amplifiers", IEEE Journal of Solid–State Circuits, vol. 26, No. 2, Feb. 1991, pp. 165–168.

Donnelly, K. et al., "A 660 MB/s Interface Megacell Portable Circuit in 0.3 μ–0.7 μ CMOS ASIC", IEEE Journal of Solid–State Circuits, vol. 31, No. 12, Dec. 1996, pp. 1995–2001.

METHOD AND APPARATUS FOR ADJUSTING THE TIMING OF SIGNALS OVER FINE AND COARSE RANGES

TECHNICAL FIELD

This invention relates to generating a precisely timed signals, and more particularly, to generating a signal having a timing that may be adjusted with a resolution of less than one clock cycle over a range of multiple clock cycles.

BACKGROUND OF THE INVENTION

Clock signals are used by a wide variety of digital circuits to control the timing of various events occurring during the operation of the digital circuits. For example, clock signals are used to designate when command signals, data signals, and other signals used in memory devices and other computer components are valid and can thus be used to control the operation of the memory device or computer system. For example, a clock signal can be used to latch the command, data, or other signals so that they can be used after the command, data, or other signals are no longer valid.

The problem of accurately controlling the timing of clock signals for high speed digital circuits is exemplified by clock signals used in high speed dynamic random access memories ("DRAMs"), although the problem is, of course, also applicable to other digital circuits. Initially, DRAMs were asynchronous and thus did not operate at the speed of an external clock. However, since asynchronous DRAMs often operated significantly slower than the clock frequency of processors that interfaced with the DRAM, "wait states" were often required to halt the processor until the DRAM had completed a memory transfer. The operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor directly through the processor bus, although it may continue to be coupled to the processor through a memory controller or other device. Rather than requiring that separate address and control signals be provided to the system memory, SyncLink memory devices receive command packets that include both control and address information. The SyncLink memory device then outputs or receives data on a data bus that may be coupled directly to the data bus portion of the processor bus.

An example of a packetized memory device using the SyncLink architecture is shown in FIG. 1. The SyncLink memory device 10 includes a clock generator circuit 40 that receives a command clock signal CMDCLK on line 42 and generates a large number of other clock and timing signals to control the timing of various operations in the memory device 10. Three of these clock signals are a command latch clock ICLK, a read data clock signal RCLK, and a write data clock signal WCLK, all of which are used in a manner described below. The memory device 10 also includes a command buffer 46 and an address capture circuit 48 which receive the internal clock signal ICLK, a command packet CA0–CA9 on a command bus 50, and a flag signal F on line 52. As explained above, the command packet contains control and address data for each memory transfer, and the flag signal F identifies the start of a command packet, which may include more than one 10-bit packet word. In fact, a command packet is generally in the form of a sequence of four 10-bit packet words on the 10-bit command bus 50. The command buffer 46 receives the command packet from the bus 50, and compares at least a portion of the packet words to identifying data unique to the memory device to determine if the command packet is being directed to that memory device rather than another memory device or some other device in a computer system. If the command buffer 46 determines that the command packet is directed to the memory device 10, it then provides a command work corresponding to the packet words to a command decoder and sequencer 60. The command decoder and sequencer 60 generates a large number of internal control signals to control the operation of the memory device 10 during a memory transfer.

The address capture circuit 48 also receives the packet words from the command bus 50 and outputs a 20-bit address corresponding to the address data in the command. The address is provided to an address sequencer 64 which generates a corresponding 3-bit bank address on bus 66, a 10-bit row address on bus 68, and a 7-bit column address on bus 70.

One of the problems of conventional DRAMs is their relatively low speed resulting from the time required to precharge and equilibrate circuitry in the DRAM array. The packetized memory device 10 shown in FIG. 1 largely avoids this problem by using several memory banks 80, in this case eight memory banks 80a–h. After a memory read from one bank 80a, the bank 80a can be precharged while the remaining banks 80b–h are being accessed. Each of the memory banks 80a–h receive a row address from a respective row latch/decoder/driver 82a–h. All of the row latch/decoder/drivers 82a–h receive the same row address from a predecoder 84 which, in turn, receives a row address from either a row address register 86 or a refresh counter 88 as determined by a multiplexer 90. However, only one of the row latch/decoder/drivers 82a–h is active at any one time. Bank control logic 94 selects one of the row latch/decoder/drivers 82a–h to be active as a function of bank data from a bank address register 96.

The column address on bus 70 is applied to a column latch/decoder 100 which, in turn, supplies I/O gating signals to an I/O gating circuit 102. The I/O gating circuit 102 interfaces with columns of the memory banks 80a–h through sense amplifiers 104. Data is coupled to or from the memory banks 80a–h through the sense amplifiers 104 and I/O gating circuit 102 to a data path subsystem 108 which includes a read data path 110 and a write data path 112. The read data path 110 includes a read latch 120 receiving and storing data from the I/O gating circuit 102. In the memory device 10 shown in FIG. 1, 64 bits of data are applied to and stored in the read latch 120. The read latch then provides four 16-bit data words to a multiplexer 122. The multiplexer 122 sequentially applies each of the 16-bit data words to a read FIFO buffer 124. Successive 16-bit data words are clocked into the FIFO buffer 124 by the read clock signal RCLK generated from the command clock CMDCLK by the clock generator circuit 40. The FIFO buffer 124 sequentially applies the 16-bit words and two clock signals (a clock signal and a quadrature clock signal) to a driver circuit 128 responsive to the read clock signal RCLK. The driver circuit 128, in turn, applies the 16-bit data words to a data bus 130. The driver circuit 128 also applies a data clock signals DCLK to a clock bus 132 so that a device, such as a processor, reading the data on the data bus 130 can be synchronized with the data.

The write data path 112 includes a receiver buffer 140 coupled to the data bus 130. The receives buffer 140 sequentially applies 16-bit words from the data bus 130 to four input registers 142, each of which is selectively enabled by a signal from a clock generator circuit 144. The clock generator circuit 144 receives a data clock signal DCLK generated by an external device applying the data to the data bus 130 of the memory device. Since the data clock DCLK is synchronized to the data applied to the data bus 130, the input registers 142 are enabled at the proper time when write data are present on the data bus 130. Thus, the input registers 142 sequentially store four 16-bit data words and combine them into one 64-bit data word applied to a write FIFO buffer 148. The write FIFO buffer 148 is clocked by the write data clock signal WCLK generated from the command clock CMDCLK by the clock generator circuit 40 and a signal from the clock generator 144. The write FIFO buffer 148 then sequentially applies 64-bit write data to a write latch and driver 150. The write latch and driver 150 applies the 64-bit write data to one of the memory banks 80a–h through the I/O gating circuit 104 and the sense amplifier 104.

As mentioned above, an important goal of the SyncLink architecture is to allow data transfer between a processor and a memory device to occur at a significantly faster rate. However, the operating rate of a packetized DRAM, including the SyncLink memory device 10 shown in FIG. 1, is limited by the need to maintain internal synchronism in the packetized DRAM. More specifically, as the operating speed of a packetized DRAM increases, it becomes more difficult to ensure that various signals are present at circuit nodes at the proper time relative to other signals. One of the limiting factors in the speed at which the memory device 10 can operate is the difficulty in controlling the relative timing between the various signals in the memory device. In particular, the amount of the delay of signals in the memory device is highly variable, and the delay is difficult to control. If, for example, the delay of the internal clock signal ICLK cannot be precisely controlled, it may cause a latch in the command buffer 48 to latch invalid packet words. Thus, the speed at which command packets can be applied to the memory device 10 is limited by the delays in the memory device 10. Similar problems exist for other control signals in the memory device 10 which control the operation of the memory device 10 during each clock cycle.

The above-described problem has been largely alleviated by using a clock generator circuit 40 that is capable of making fine resolution adjustments if the phase of the internal clock signal ICLK relative to the command clock CKCMD. An example of a clock generator circuit 40 having these capabilities is described in U.S. patent application Ser. No. 08/879,847 to Ronnie M. Harrison which is incorporated herein by reference. The clock generator circuit 40 described therein is able to adjust the phase of the internal clock signal ICLK relative to the time in which packet words are applied to a latch in the command buffer 46 in increments of significantly less that a single clock cycle, i.e., in increments of 11.25 degrees. As a result, the phase of the internal clock ICLK can be adjusted so that the packet words are clocked into the command buffer 46 at the proper time even at high operating speeds of the memory device 10.

Although the approach described in U.S. patent application Ser. No. 08/879,847 is capable of ensuring accurate synchronization between internal signals inside the memory device 10, it may not be capable of ensuring accurate timing of signals applied to and received from devices that are external to the memory device 10. For example, it may be difficult for the memory device to apply read data to a memory controller or other device at the proper time, particularly at high operating speeds. One of the reasons that the approach described by Harrison may not be able to synchronize these signals is that it may be necessary to adjust the timing of the signals over time periods that are far in excess of the range of adjustment that are possible with the Harrison approach. In particular, the Harrison approach is limited to phase adjustments over a range of 180 degrees, it may be necessary to adjust the phase of signals in the memory device 10 over ranges of many clock cycles, particularly at high operating speeds.

As mentioned above, the above-described problem may be particularly severe for coupling read data from the memory device 10 to external devices, such as a memory controller, because it is very difficult to predict and control the time required for data from the memory device to be coupled to and latched by the external device, particularly at high operating speeds. As the operating speed of the memory device increases, the time that the read data is applied to the external device must be controlled very precisely to resolutions of less than a clock cycle. Moreover, the time required for the read data to be applied to the external device can vary considerably, depending on several factors. Thus, the precise control of the time that the read data is applied to the external device must be accomplished over a range of several clock cycles. As the operating speed of memory device continues to increase, adjusting the time that the read data is applied to the external device with sufficient precision over a sufficiently wide range is increasingly difficult.

Although the foregoing discussion is directed to the need to precisely control the timing of read data applied to an external device, similar problems exist for other signals in packetized memory devices and for the same or other signals in other memory devices, such as asynchronous DRAMs and synchronous DRAMs, which must process control and other signals at a high rate of speed. For example, the data clock DCLK must also be applied to an external device, such as a memory controller, at a precise time over a wide range. Thus, there is a need to precisely control the timing of clock signals relative to other signals over a wide range in packetized DRAMs and other circuits.

SUMMARY OF THE INVENTION

A variable delay circuit generates a digital signal having a controlled timing with a fine resolution over a wide range. The variable delay circuit may be used to precisely control the timing of read data and a data clock to an external device, such as a memory controller. The variable delay circuit includes a fine delay circuit and a coarse delay circuit. The fine delay circuit alters the timing of the digital signal with a fine resolution over a relatively small delay range between a predetermined minimum delay and less than a predetermined maximum delay. The delay of the fine delay circuit is determined by a fine delay control signal. The coarse delay circuit controls the timing of the digital signal in relatively large delay increments responsive to a coarse delay control signal. The fine delay circuit is controlled by a first control circuit that generates the fine delay control signal through suitable means. For example, the first control circuit may generate the fine delay control signal responsive to a command signal from an external device, such as a memory controller. The coarse delay circuit is controlled by a second control circuit that generates the coarse delay control signal. The second control circuit changes the timing of the digital signal whenever the delay of the fine delay circuit approaches or reaches the predetermined minimum delay or the predetermined maximum delay. The coarse delay in decreased whenever the delay of the of the fine delay circuit falls to within a predetermined range of the predetermined minimum delay. The coarse delay is increased whenever the delay of the of the fine delay circuit increases to within a predetermined range of the predetermined maximum delay. The fine delay circuit preferably includes a multi-tap delay line and a multiplexer that selects one of the taps of the delay line. The first control circuit then selects different delay line taps to adjust the delay of the fine delay circuit. The second control circuit preferably includes an up/down counter that is incremented or decremented when the delay of the of the fine delay circuit is within a predetermined range of the predetermined minimum and maximum delays, respectively. The count of the counter then determines the timing of the digital signal.

DETAILED DESCRIPTION OF THE INVENTION

Figure 2:
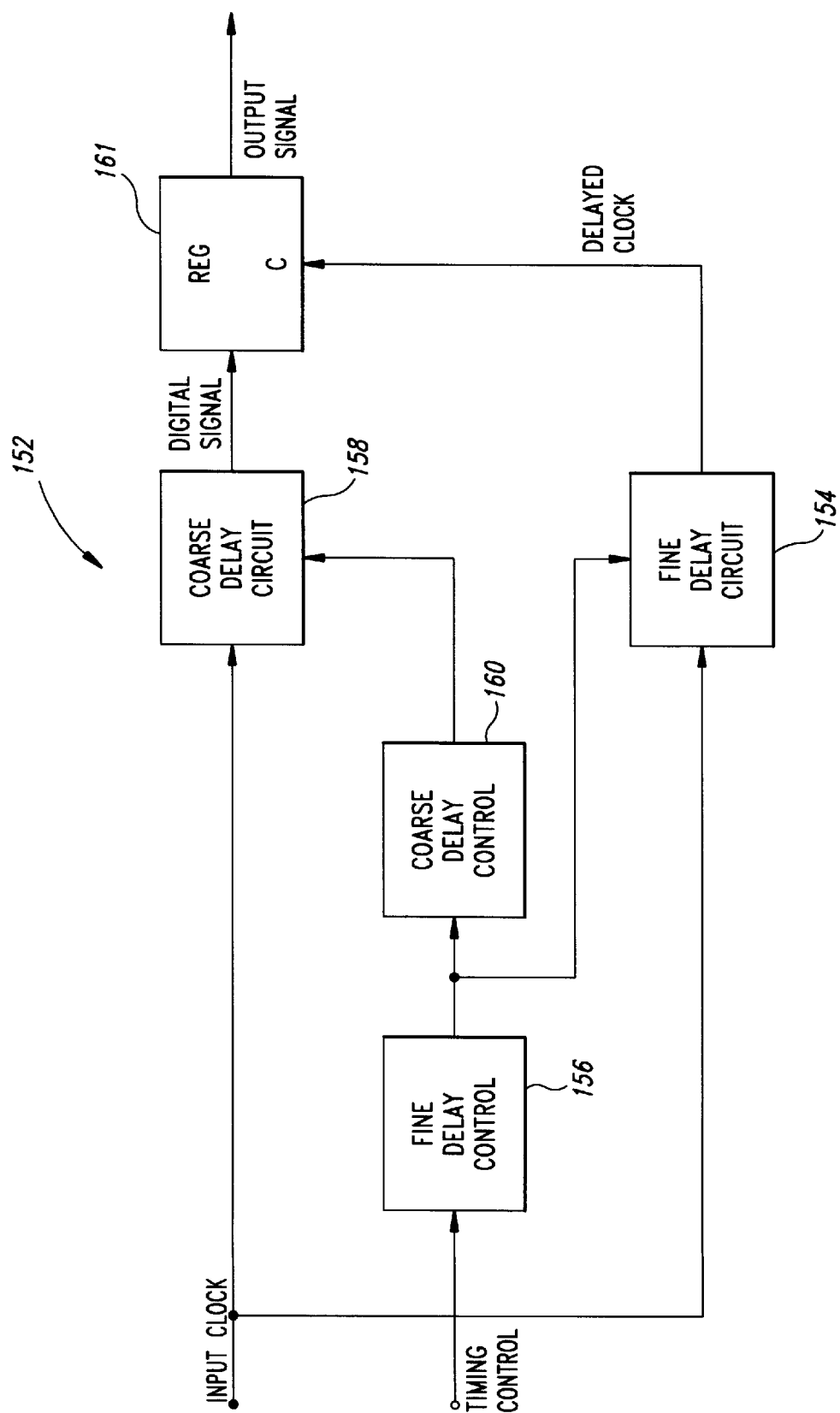
FIG. 2 is a block diagram of one embodiment of the inventive variable delay system that may be used in a wide variety of applications.

One embodiment of a variable delay circuit 152 in accordance with the invention is illustrated in FIG. 2. The variable delay circuit 152 includes a fine delay circuit 154 that receives an input clock signal and outputs a delayed clock signal. The delayed clock signal is delayed in time relative to the input clock signal. The magnitude of the delay is determined by a fine delay control signal generated by a fine delay control circuit 156. The delay range of the fine delay circuit 154 extends between a predetermined minimum delay and a predetermined maximum delay. The delay of the fine delay circuit 154 may be adjusted continuously or in increments. Further, where the input clock signal is a periodic signal, the delayed clock signal may be delayed from the input clock signal by a predetermined phase delay. In such case, the fine delay circuit 154 may adjust the phase of the delayed clock signals either continuously or in phase increments. For example, the phase of the delayed clock signal relative to the input clock signal may be the product of P and N, where P is a phase increment, such as 10 degrees, and N is a number selected by the fine delay control signal between 0 and 17.

In operation, the fine delay control circuit 156 receives a timing command from an external device, such as a memory controller (not shown in FIG. 2). The fine delay control circuit 156 then causes the fine delay circuit 154 to adjust the delay of the input clock signal to achieve a desired timing relationship between the input clock signal and the delayed clock signal.

The variable delay circuit 152 also includes a coarse delay circuit 158 that controls the timing of a digital signal. The digital signal is preferably generated responsive to the input clock signal. The coarse delay circuit 158 is controlled by a coarse delay control circuit 160. The coarse delay control circuit 160, in turn, receives the fine delay control signal from the fine delay control circuit 156.

In operation, if the delay of the fine delay circuit 156 approaches either the predetermined minimum delay or the predetermined maximum delay, the coarse delay control circuit 160 causes the coarse delay circuit 158 to change the timing of the digital signal. The timing of the digital signal is preferably changed in increments that are one-half the period of the delayed clock. Thus, the coarse delay circuit 158 is able to adjust the timing of the digital signal over a range that is substantially greater than the delay range of the fine delay circuit 154. The coarse delay control circuit 160 is able to determine when the delay of the fine delay circuit 154 approaches either the predetermined maximum delay or the predetermined minimum delay because the fine delay control signal generated by the fine delay control circuit 156 determines the delay of the fine delay circuit 154.

The coarse delay circuit 158 applies the digital signal to a register 161 that is clocked by the delayed clock from the fine delay circuit. The delayed clock signal, in effect, creates a periodic "transmission window" during which any digital signal that is applied to the input of the register 161 is coupled to the output of the register 161. The transmission window of the register 161 thus occurs once during each cycle of the input clock signal, and it is delayed in time by the delay of the fine delay circuit 154. The particular transmission window during which the digital signal is coupled to the output of the register 161 is determined by the coarse delay circuit 158.

In summary, the fine circuit 154 determines the precise timing of the transmission window of the register 161 each clock cycle, and the coarse delay circuit 158 selects which of these transmission windows will be used to coupled the digital signal to the output of the register by applying the digital signal to the input of the register only during the selected transmission window. As a result, an output signal from the variable delay circuit 152 has a time controlled by both the fine delay circuit 154 and the coarse delay circuit 158. The timing of the output signal thus has the fine precision of the fine delay circuit 154 and the wide range of the coarse delay circuit 158.

Figure 1:
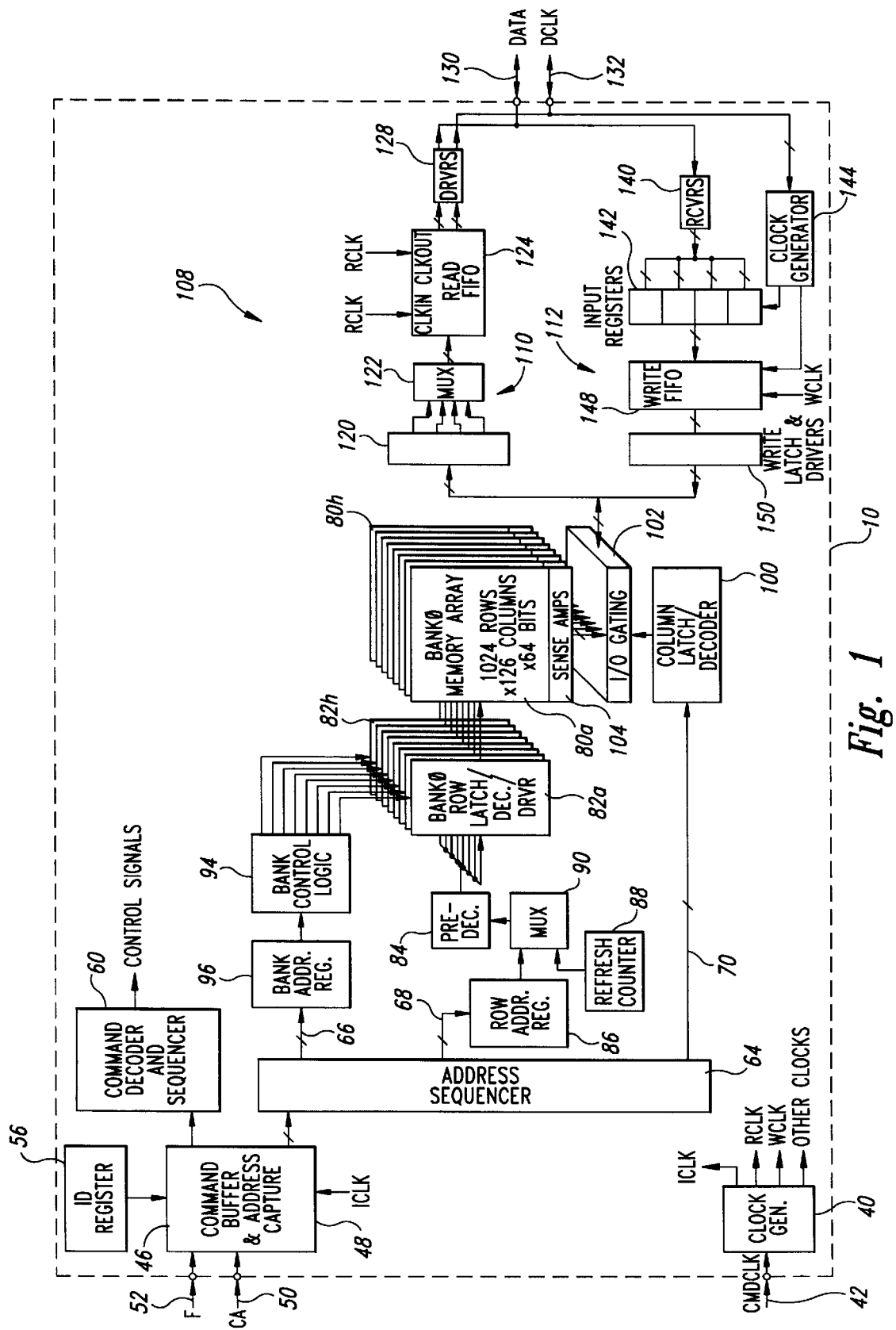
FIG. 1 is a block diagram of a conventional packetized dynamic random access memory ("DRAM") that may advantageously use a variable delay circuit in accordance with an embodiment of the present invention.

The variable delay circuit 152 can be used in a variety of applications, including a memory device, such as in the packetized memory device 10 shown in FIG. 1. In such cases, the coarse delay circuit 158 is used to select the clock cycle in which read data is applied to a read register, i.e., the register 161, and the delayed clock signal from the fine delay circuit 154 is used to determine when during that clock cycle the read data is applied to the data bus of the memory device.

Figure 3:
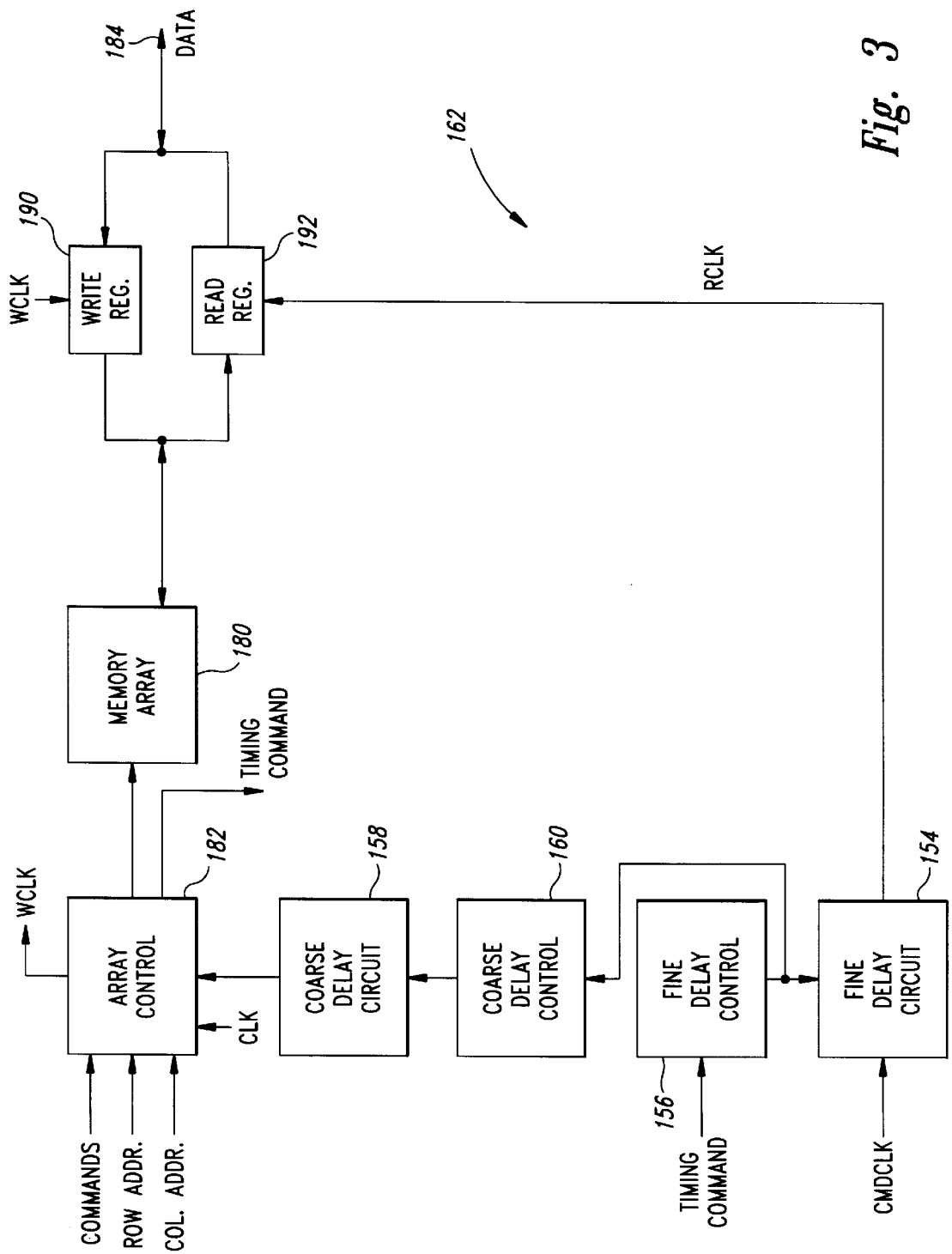
FIG. 3 is a block diagram of the variable delay system of FIG. 2 used in a memory device, such as the memory device of FIG. 1.

An example of a memory device 161 using the variable delay circuit 152 is shown in FIG. 3 in which the components of the variable delay circuit 152 have retained the same reference numerals used in FIG. 2.

The memory device 162 includes a memory array 180, the operation of which is controlled by an array control circuit 182. The array control circuit 182 receives memory commands as well as a row address and a column address. The memory array 180 responds to the commands by either storing write data in the array 180 or outputting read data from the array 180. The commands also include timing information provided by the external device that is decoded by the array control circuit 182 and applied to the fine delay control circuit 156 as a timing command. As explained above, this timing command adjusts the timing of the fine delay circuit 154.

The write data is coupled from a data bus terminal 184 to a write register 190, and is coupled through the write register 190 to the memory array 180 responsive to a pulse of the write data clock signal WCLK. The read data is coupled from the memory array 180 to a read register 192, and is coupled through the read register 192 to the data bus terminal 184 responsive to a pulse of the read data clock signal RCLK generated by the fine delay circuit 154.

In operation, the array control circuit 182 receives a read command as well as a row address and a column address specifying the location in the array 180 from which data are to be read. After a period of time corresponding to the read latency of the memory device 162, the memory array 180 applies read data to the read register 192. The read data is then coupled through the read register 192 to the data bus terminal 182 responsive to a pulse of the read data clock signal RCLK from the fine delay circuit 154. The read clock signal RCLK is thus a delayed clock signal since is a version of the command clock signal CMDCLK delayed by the fine delay circuit 154.

It is important that the read data be applied to an external device (not shown), such as a memory controller, at the proper time. If the read clock signal RCLK is applied to the read register too late, the read data may be applied to the data bus of the memory device 162 so late that, by the time the read data reaches the external device, the external device is not longer ready to receive it. Conversely, if the read clock signal RCLK is applied to the read register too early, the read data may be applied to the data bus of the memory device 162 so early that the read data reaches the external device before the external device is ready to receive it. At very high operating speeds, it is very difficult to apply the read clock signal RCLK to the read register at the proper time, particularly since the proper time from the point of view of the external device can vary widely. However, by adjusting the timing of the read clock signal RCLK and/or the read data from the memory array 180, is possible to the maintain synchronism between the read data and the read clock signal RCLK even at very high operating speeds and at different read latencies. Furthermore, the fine resolution of the fine delay circuit 154 insurers that the read data can sent to the external device with sufficient precision, and the relatively large timing adjustments of the read data made possible by the coarse delay circuit 158 insurers that the read data can sent to the external device with a sufficient range of timing variations.

Figure 4:
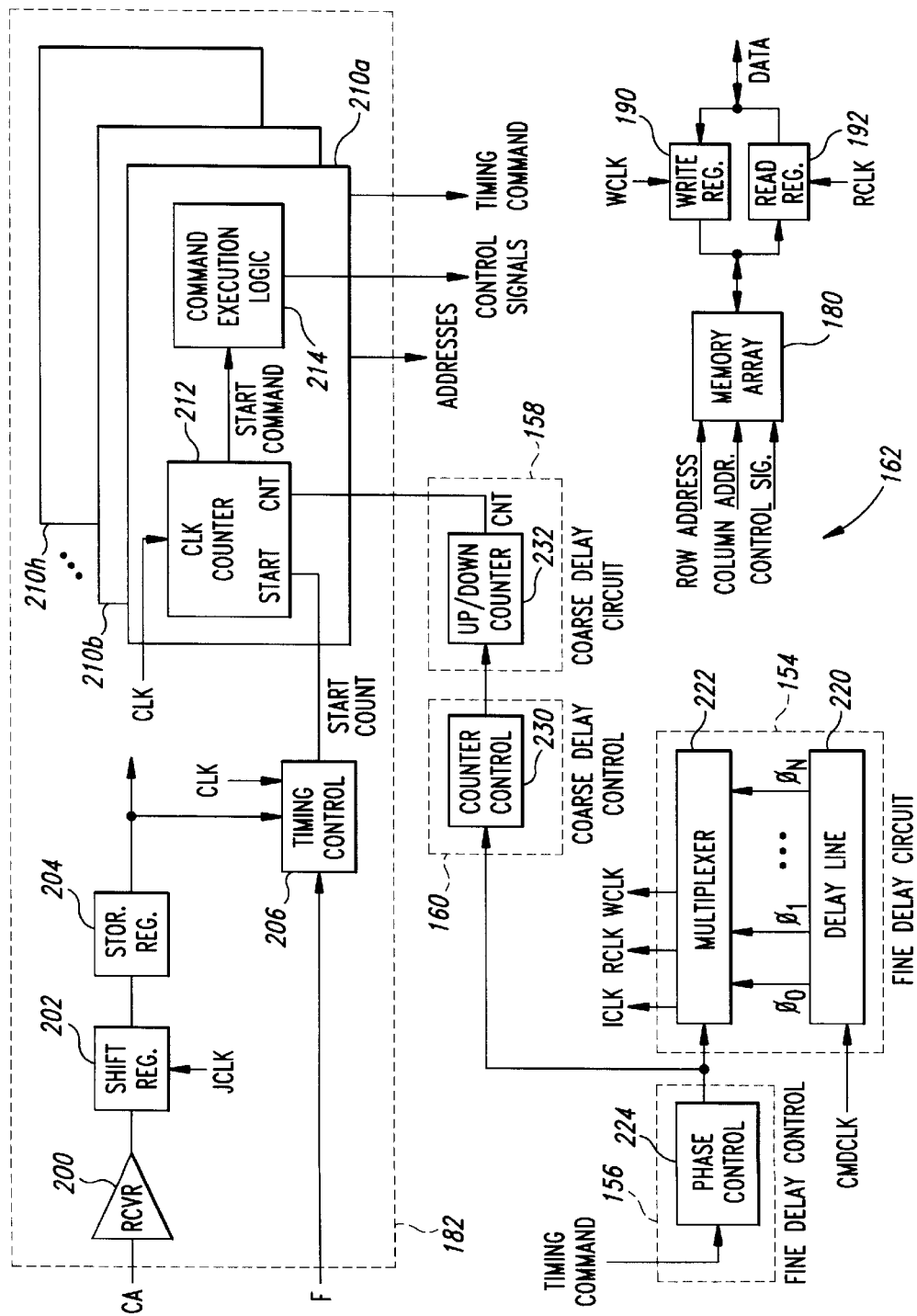
FIG. 4 is a block diagram of a portion of the memory device of FIG. 3.

The memory device of FIG. 3 is illustrated in greater detail in FIG. 4 in which corresponding components in both figures have been provided with the same reference numerals. The array control circuit 182 includes a receiver 200 that receives packet words CA making up each command packet. Each command packet contains both memory commands and memory addresses (i.e., a row address and a column address), however, some command packets contain timing information specifying timing adjustments of the read data output from the memory device, as mentioned above. However, it will be understood that other types of memory devices receive separate memory commands and addresses. The packet words are sequentially shifted into a shift register 202 responsive to the internal clock signal ICLK. After two or more packet words have been shifted into the shift register 202, they are applied to a storage register 204 until all of the packet words in the command packet are stored in the storage register 204. The storage register 204 then outputs a single command word combining all of the packet words in the command packet. At least some of the bits of the command word are applied to a timing control circuit 206 that also receives a flag signal F. The flag signal F signifies the start of a command packet. The timing control circuit 206 generates a START COUNT pulse responsive to the flag signal F at a time that is a function of some of the command words bits applied to the timing control circuit 206 from the storage register 204. For example, the START COUNT pulse may depend upon the nature of the command. For example, the START COUNT pulse may be generated at different times depending upon whether the command is for a read operation or a write operation.

The START COUNT pulse from the timing control circuit 206 is applied to a set of command units 210*a–h*, each of which includes a counter 212 and command execution logic 214. Although eight command units 210*a–h* are shown in FIG. 4, it will be understood that a smaller or larger number of command units may be used. The counter 212 may be either an incrementing counter or a decrementing counter. In either case, the counter 212 begins incrementing from an initial count toward a terminal count responsive to the START COUNT pulse from the timing control circuit 206. When the counter 212 reaches the terminal count, it generates a START COMMAND pulse. The initial counts is applied to the counter input CNT of the counter 212 from the coarse delay control circuit 160, as explained below.

The START COMMAND pulse is applied to the command execution unit 214 which generates control signals to cause the memory array 180 to either store write data or output read data. The command execution unit 214 also outputs a timing command to adjust the delay of the fine delay circuit 154, as mentioned above. The structure and operation of the command units 210 are described in greater detail in U.S. patent application Ser. Nos. 08/877,191 and 08/874,690.626 to Troy A. Manning which are incorporated herein by reference.

As mentioned above, the timing of the read data applied to an external device may vary greatly. Not only may the timing of the control signals vary relative to the START COUNT pulse (assuming the initial count is constant), but the timing of the START COUNT pulse relative to the flag signal F can vary widely since, as explained above, the timing of the START COUNT pulse varies depending upon the nature of the memory transfer operation. Even if the correct timing of the read data as they are applied to the data bus could be maintained, the delay of the read data as they propagate to the external device is difficult to control and it can vary greatly. Thus, is extremely difficult for the memory device 162 to apply the read data to an external device at the proper time.

Returning to FIG. 4, the fine delay circuit 154 includes a multi—tapped delay line 220 that receives the command clock signal CMDCLK and outputs a series of clock signals that are increasingly delayed from each other by equal phase increments. The clock signals from the delay line taps are applied to a multiplexer 222. The multiplexer 222 is controlled by a phase control circuit 224 in the fine delay control circuit 156 to select one of the delay line taps for use as the internal clock signal ICLK, the same or a different tap for use as the read clock signal RCLK, and the same or a different tap for use as the write clock signal WCLK.

The output of the phase control circuit 224 is also applied to a counter control circuit 230 in the coarse delay control circuit 160. The control circuit 230 will be described in detail below. The counter control circuit 230 increments or decrements an up/down counter 232 in the coarse delay circuit 158. The up/down counter 232 will also be described in detail below.

In operation, since the output of the phase control circuit 224 specifies the multiplexer tap that is used to generate the read clock signal RCLK responsive to the timing commands from the command execution logic 214. These timing commands correspond to timing information in a command packet CA applied to the memory device 162 by an external device.

The counter control circuit 230 is able to determine when either the first or the last tap has been selected for use as the read clock signal RCLK because it receives the output of the phase control circuit 224 that selects which tap is used as the read clock signal RCLK. Whenever either the first or the last tap has been selected by the multiplexer 222, the counter control circuit 230 increments or decrements the up/down counter 232. If the first tap of the delay line 220 has been selected, the read clock signal RCLK is being applied to the read register 192 (FIG. 3) as early as is possible using the delay range of the fine delay circuit 154. Thus, the fine delay circuit 154 has reached the limit of its ability to ensure that the read clock signal RCLK is synchronized to be read data applied to the read register 192. Under these circumstances, the counter control circuit 230 outputs a pulse to decrement the up/down counter 232, thereby decreasing the initial count value CNT. Since the initial counter value of the counter 212 has been decreased, it takes less time for the counter 212 to count down to the terminal count. (Assuming that the counter 212 is a down-counter). Consequently, the counter 212 outputs the START COMMAND pulse at an earlier time so that the read data is applied to the read register 192 one clock cycle earlier. The phase control circuit 225 then causes the multiplexer to "wrap" by selecting the last tap of the delay line 220. As a result, the timing of read data being applied to the data bus is adjusted from the earliest time in a clock cycle to the latest time in the previous clock cycle.

Similarly, if the multiplexer 222 has selected the last tap of the delay line 220, the read clock signal RCLK is being applied to the read register 192 (FIG. 3) as late as is possible using the delay range of the fine delay circuit 154. The counter control circuit 230 then outputs a pulse to increment the up/down counter 232, thereby increasing the initial count value CNT. Since the initial count value of the counter 212 has been increased, it takes a longer time for the counter 212 to count down to the terminal count. Consequently, the counter 212 outputs the START COMMAND pulse at a later time so that the read data is applied to the read register 192 one clock cycle later. The phase control circuit 225 then causes the multiplexer to again "wrap" by selecting the first tap of the delay time 220. As a result, the timing of read data being applied to the data bus is adjusted from the latest time in a clock cycle to the earliest time in the next clock cycle.

Although the fine delay circuit 154 has been described as adjusting the phase of the read clock signal RCLK in phase increments, it will be understood that a fine delay circuit 154 may also continuously adjust the delay of the read clock signal RCLK. Also, by describing the fine delay circuit 154 as adjusting the phase of the read clock signal, it is implied that the command clock signal CMDCLK applied to the delay line 220 is a periodic signal. However, in the event a non—periodic signal is applied to the fine delay circuit 154, the fine delay circuit 154 adjusts the timing—rather than the phase—of the read clock signal RCLK. Finally, although the counter control circuit 230 has been described as incrementing or decrementing the counter 232 when the first or last tap has been selected by the multiplexer 222, it will be understood that the counter 232 may be incremented or decremented it when other taps of the delay line 222 (e.g., the second and second to last taps) have been selected.

Figure 5:
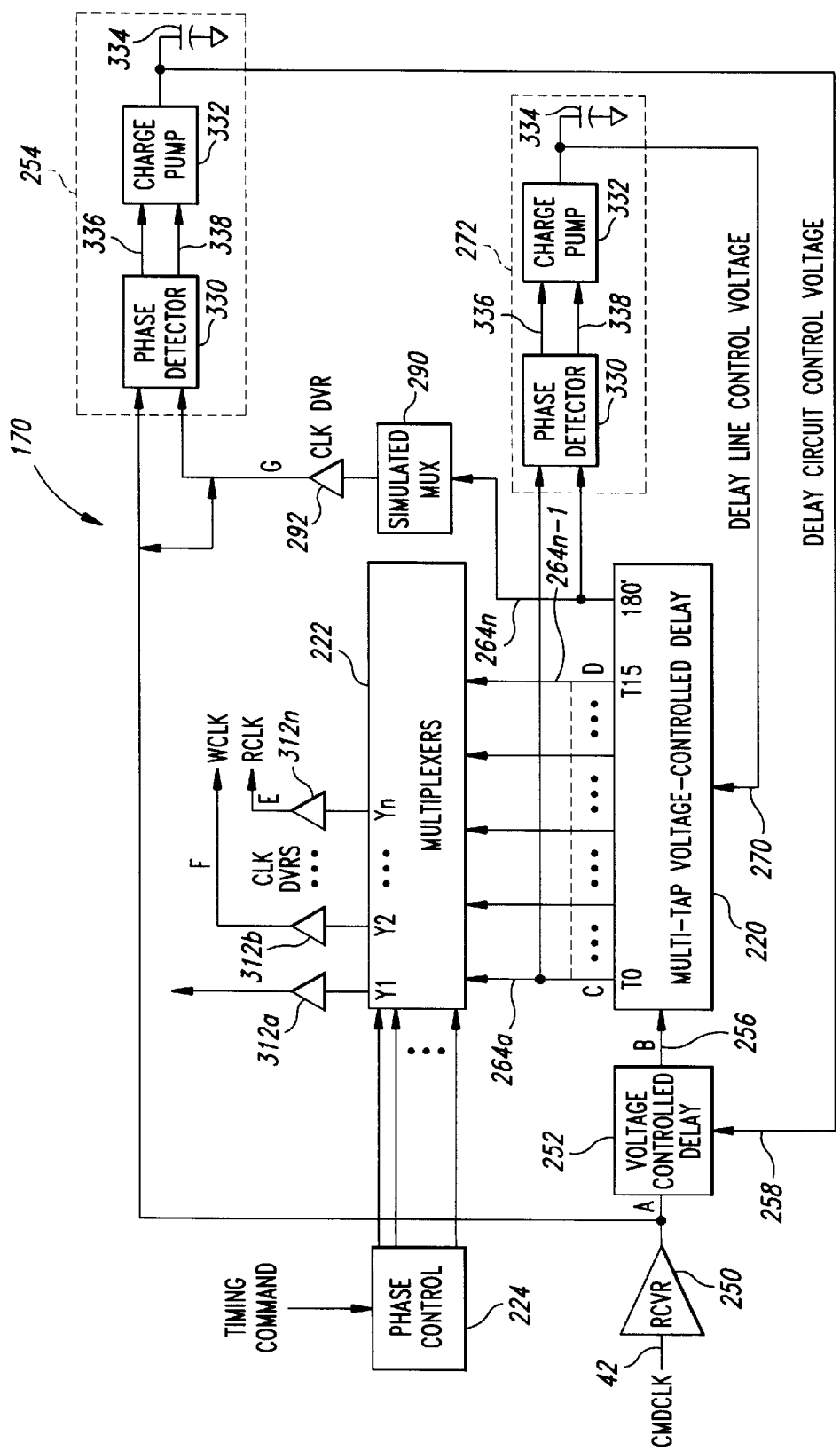
FIG. 5 is a more detailed block diagram of a fine delay circuit used in the memory device of FIG. 4.

The fine delay circuit 154 is shown in greater detail in FIG. 5. The command clock signal CMDCLK is coupled from line 42 (FIGS. 1 and 5) through a receiver buffer 250 to a conventional voltage controlled delay circuit 252 and to one input of a phase detector 254. The voltage controlled delay circuit 252 couples the output of the receiver buffer 250 to an output line 256 with a delay that is a function of a control signal applied to the delay circuit 252 on line 258. Although the control signal on line 258 is an analog voltage, it will be understood that other types of control signals, including digital words, may alternatively be used. The output of the voltage controlled delay circuit 252 is applied to the delay line which, in this case, is a multi-tap voltage controlled delay line 220'.

The multi-tap voltage controlled delay line 220' couples the clock signal applied to its input line 256 to a plurality of taps 264a–264n with incrementally increasing delays from the first tap 264a to the last tap 264n. In the embodiment illustrated in FIG. 5, there are 17 taps 264, but the delay line 220' may have a greater or less number of taps 264. When a delay locked loop that includes the delay line 220' is locked as explained below, the signals at the first tap 264a and the last or 17$^{th}$ tap 264n are the inverse of each other, i.e., phased 180 degrees from each other. Thus, the signals on the 17 lines are delayed by 11.25 degrees more than the signal coupled to the previous line 264. The signal on the first tap 264a has a relative phase of zero degrees, the signal on the 16$^{th}$ tap 264n-1 has a phase of 168.75 degrees and the signal on the last tap 264a has a phase of 180 degrees. A control voltage applied to the delay line 220' through line 270 is adjusted so that the phase of the signal on the last tap 264n relative to the phase on the first tap 264a is 180 degrees. This is accomplished by applying the first tap 264a and the last tap 264n to respective inputs of a phase detector 272.

As mentioned above, the delay line 220' and phase detector 272 implement a first delay locked loop. When the first delay locked loop is locked, the signal on the tap 264n will have a phase relative to the phase of the signal on the tap 264a of 180 degrees. Therefore, as mentioned above, the signal on each of the taps 264a–264n will sequentially increase from zero degrees to 180 degrees. Although the signals on the taps 264a–n are equally phased apart from each other, it will be understood that equal phasing is not required.

The fine delay circuit 154 also includes a second delay locked loop formed by the phase detector 254, the voltage controlled delay circuit 252 and the voltage controlled delay line 220'. The last tap 264n of the delay line 220' is applied through a simulated multiplexer circuit 290 and a clock driver 292 to one input of the phase detector 254. It will be recalled that the other input of the phase detector 254 receives the output of the receiver buffer 250. Like the phase detector 272, when the second delay locked loop is locked, the signals applied to the phase detector 254 are the inverse of each other. Thus, when the second loop is locked, the phase of the signal at the output of the clock driver 292 is 540 degrees (effectively 180 degrees) relative to the phase of the signal at the output of the receiver buffer 250.

The remaining taps 264a–264n-1 of the delay line 220' are coupled to the multiplexer 222. As explained above, the multiplexer has a plurality of output lines, and these output lines are coupled to respective clock drivers 312a–n. The multiplexer 222 coupled the input of each of the clock drivers 312a–n to any one of the taps 264a–264n-1 as determined by the fine delay control signal from the phase control circuit 224.

The phase detectors 254, 272 are each implemented using a phase detector circuit 330, a charge pump 332 and a capacitor 334. However, other varieties of phase detectors may alternatively be used. The phase detector circuit 330 applies either an increase signal on line 336 or a decrease signal on line 338 to respective inputs of the charge pump 332. The phase detector circuit 330 generates the increase signal on line 336 whenever the phase of a first signal on one of its inputs relative to a second signal on the other of its inputs is less than 180 degrees. As explained below, the increase signal on line 336 causes the charge pump 332 to adjust the control voltage to increase the delay of the first signal so that the phase of the first signal relative to the phase of the second signal approaches 180 degrees. The phase detector circuit 330 generates the decrease signal on line 338, in the opposite condition, i.e., when the phase of the second signal relative to the first signal is greater than 180 degrees. The decrease signal on line 338 causes the charge pump 332 to adjust the control voltage to reduce the delay of second signal toward 180 degrees.

Although the phase detector circuit 330 may be implemented in a variety of ways, it may simply use two set-reset flip-flops (not shown) for generating the increase and decrease signals, respectively. The increase flip-flop is set by the rising edge of the first signal on one of the inputs and reset by the falling edge of the second signal on the other input. Thus, the duration that the flip-flop is set, and hence the duration of the increase signal on line 336, corresponds to the period of time that the second signal must be further delayed to have a phase of 180 degrees relative to the phase of the first signal. Similarly, the flip-flop producing the decrease signal on line 338 is set by the falling edge of the second signal and reset by the rising edge of the first signal so that the duration of the decrease signal on line 338 corresponds to the time that the second signal is delayed beyond the time that it would have a phase of 180 degrees relative to the phase of the first signal.

There are also a variety of approaches for implementing the charge pump 332. However, the charge pump 332 can be implemented by simply applying a constant current to the capacitor 334 for the duration of each increase signal on line 336 and removing a constant current from the capacitor 334 for the duration of each decrease signal on line 338. Appropriate circuitry could also be included in either the phase detector circuit 330 or the charge pump 332 to provide hysteresis in a band when the first and second signals have relative phases of approximately 180 degrees from each other as will be apparent to one skilled in the art.

Figure 6:
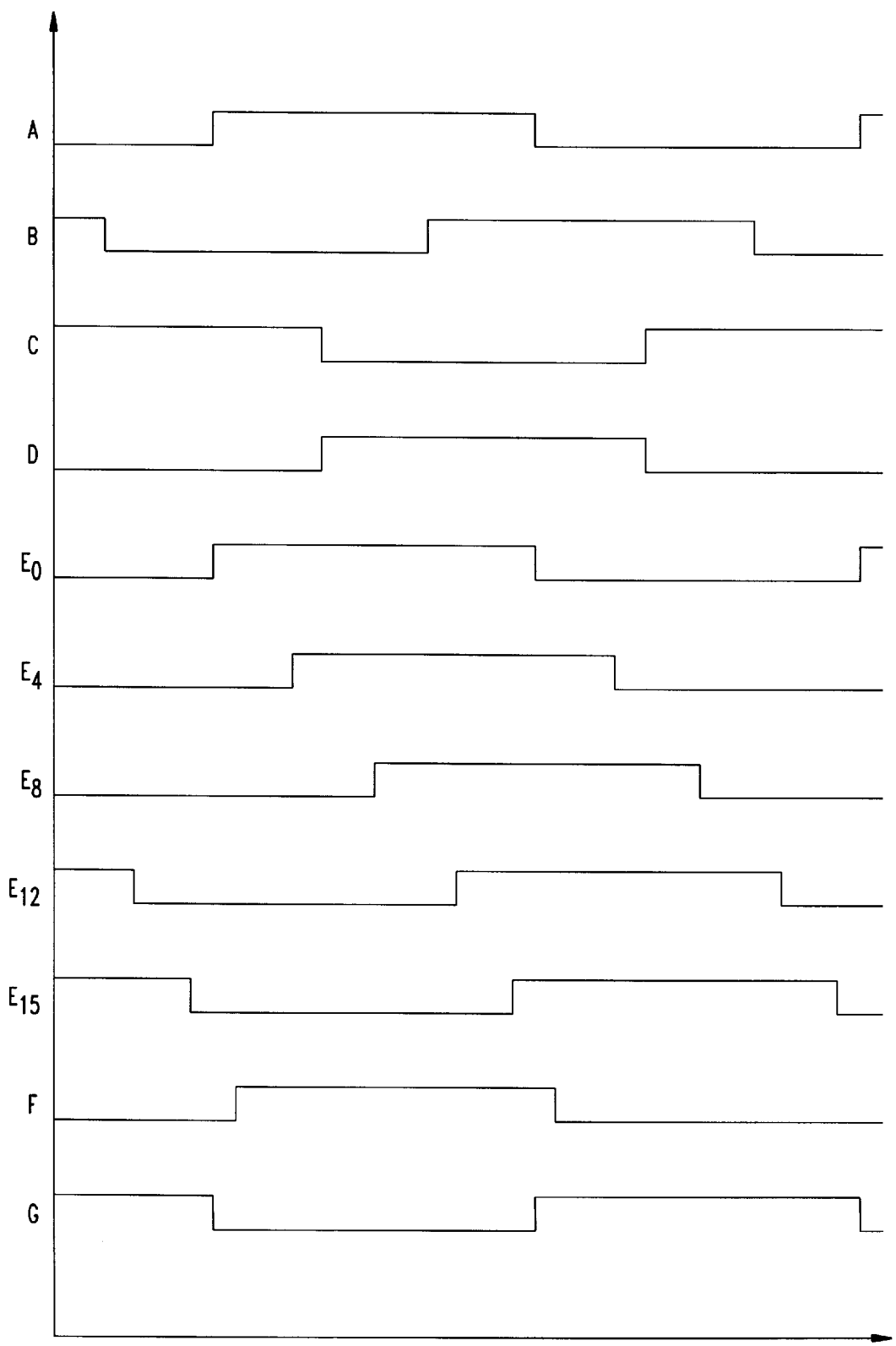
FIG. 6 is a timing diagram showing many of the waveforms present in the fine delay circuit of FIG. 5.

The operation of the fine delay circuit of FIG. 5 can best be explained with reference to the timing diagram of FIG. 6. As illustrated in FIG. 6, the command clock signal CMDCLK on line 42 is delayed by approximately 70 degrees in passing through the receiver buffer 250 to node A (FIG. 5). Assuming that both of the delay-lock loops are locked, the signal at the output of the receiver buffer 250 is delayed by 120 degrees in passing through the voltage controlled delay circuit 252 to node B. The signal on node B is then coupled to node C with a delay of another 120 degrees and to node D with a delay of 300 degrees so that the signals at nodes C and D are phased 180 degrees apart from each other. Since the signals at nodes C and D are compared to each other by the phase detector 272, the phase detector 272 adjusts the control voltage on line 270 to ensure that the signals at nodes C and D are phased 180 degrees from each other. The signals on other taps of the delay line 220' have phases relative to the phase of the signal at node C that increase 11.25 degrees for each tap in sequence from the first tap 264a to the last tap 264n.

As mentioned above, one of the first 16 taps 264a–264n-1 of the delay line 220' is coupled through the multiplexer 222 and the clock driver 312n to provide the read clock signal RCLK at node E. In passing through the multiplexer 222 and the clock driver 312n, the selected output from the delay line is delayed by another 120 degrees. Thus, the signal $T_0$ coupled from the first tap of the delay line 220' is delayed by 120 degrees, the signal $T_4$ from the fifth tap is delayed by 165 degrees, the signal $T_8$ from the ninth tap is delayed by 210 degrees, the signal $T_{12}$ from the $13^{th}$ tap is delayed by 255 degrees, and the signal $T_{15}$ from the $16^{th}$ tap is delayed by 288.75 degrees. Although the output signals are coupled from the delay line 220' through the multiplexer 222 and clock driver 312n with a delay, that delay is matched by the coupling of the signal from line 264n through the simulated multiplexer 290 and clock driver 292 since the same circuit is used for the simulated multiplexer 290 as the multiplexer 222, and the clock driver 292 is identical to the clock driver 312n. For this reason, and because the phase of the signal on the tap 264n is 180 degrees relative to the phase of the signal on the tap 264a, the signal at the output of the clock driver 292 at node G has a phase relative to the phase of the signal $T_0$ of 180 degrees. Since the signals applied to the inputs of the phase detector 254 are the inverse of each other when the delay-locked loop is locked, the signal $T_0$ has substantially the same phase as the signal at the output of the receiver buffer 250.

In summary, the "inner" delay locked loop formed by the phase detector 272 and the voltage controlled delay circuit 220' generates a sequence of signals that have increasing phases from zero to 180 degrees. The "outer" delay locked loop formed by the phase detector 254, the voltage controlled delay circuit 252 and the delay line 220' align one of the clock signals in the sequence to the command clock signal CMDCLK. As a result, all of the clock signals at the taps of the delay line 220' have respective predetermined phases relative to the phase of the command clock signal CMDCLK at node A.

Although the embodiment of the fine delay circuit 154 illustrated in FIG. 5 uses delay-locked loops, it will be understood that other locked loop circuits, such as phase-locked loop circuits, may also be used. Other modifications will also be apparent to one skilled in the art.

Figure 7A:
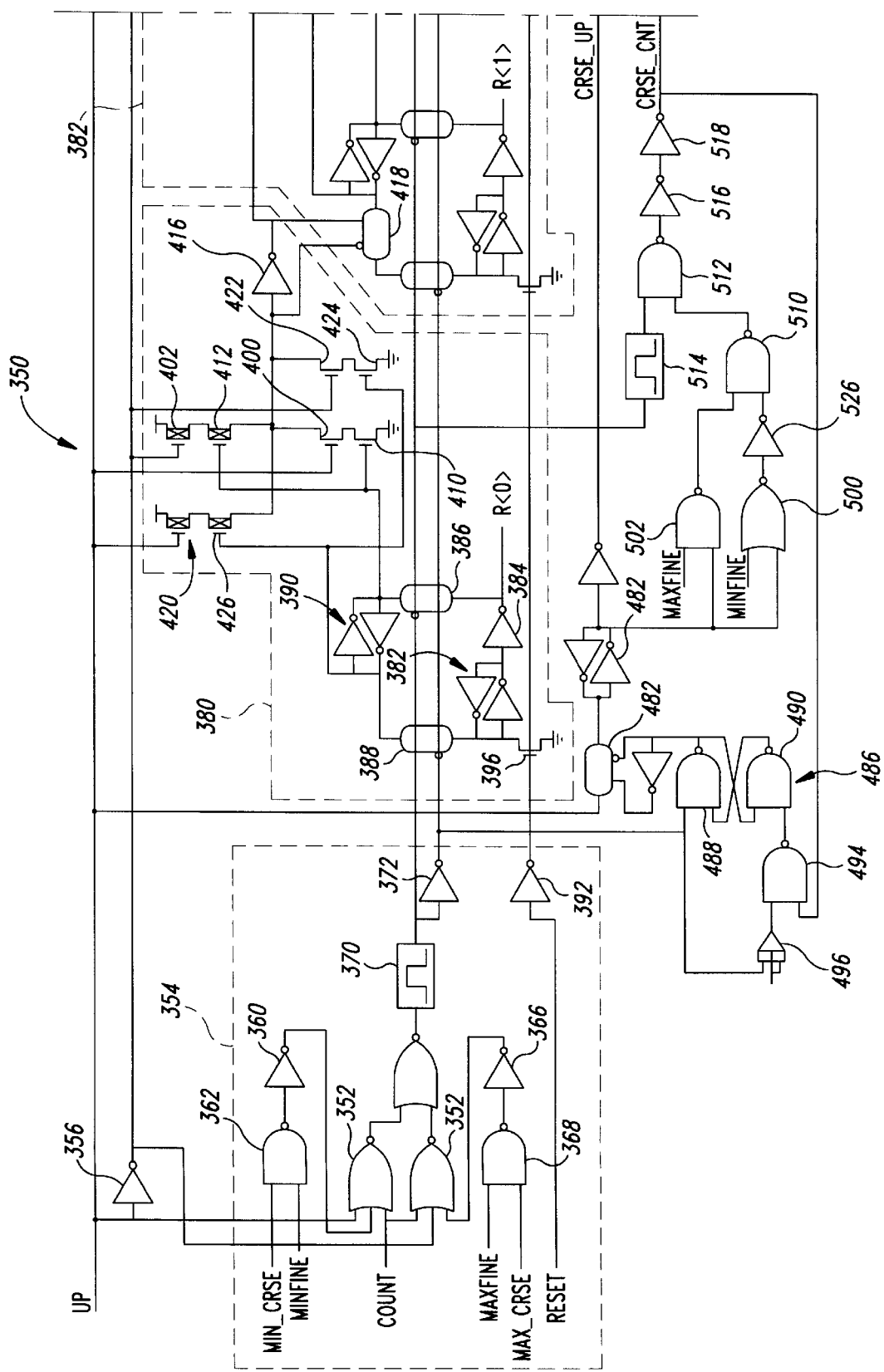
FIG. 7 is a logic diagram of a circuit for controlling the operation of the fine delay circuit of FIG. 5.
Figure 7B:
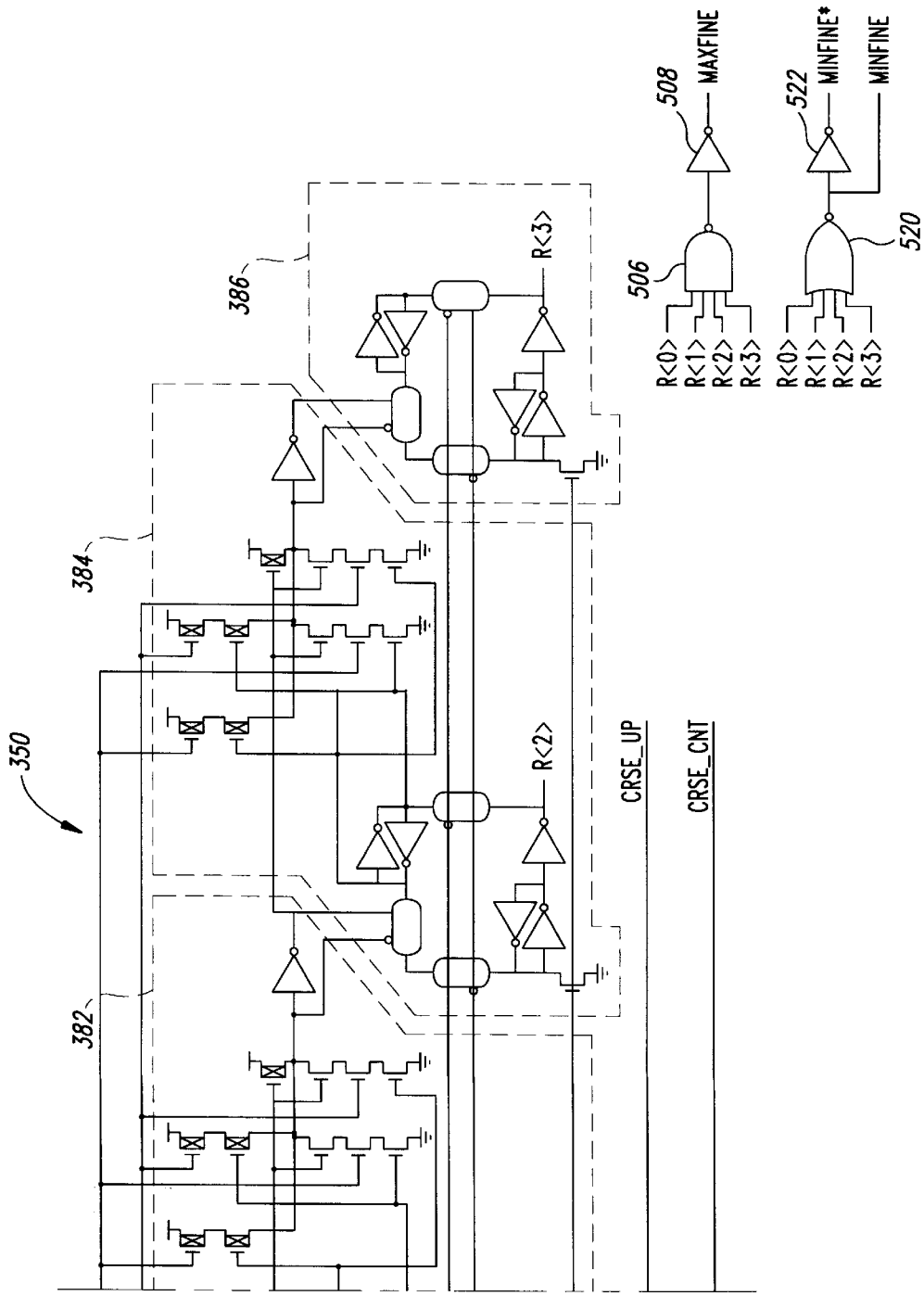

A counter 350 used in the phase control circuit 224 is illustrated in FIG. 7. The counter 350 receives a control signal UP that provides an indication of whether a higher numbered or lower numbered tap of the delay line 220' should be selected by the multiplexer 222. As explained above, the signal UP is derived from timing information provided to the memory device by the external device that receives the read data from the memory device.

The UP signal is applied to a NOR gate 352 in a logic circuit 354, and its complement is generated by an inverter 356 and applied to a NOR gate 358. If UP is high, the NOR gate 358 is enabled by the low at the output of the inverter 356. If UP is low, the NOR gate 352 is enabled. The NOR gate 352 receives the output of an inverter 360 which, in turn, receives the output of a NAND gate 362. The NAND gate 362 receives a minimum coarse signal MIN_CRSE and a minimum fine signal MINFINE. The MIN_CRSE signal is high whenever the coarse delay circuit 158 is operating at its minimum delay. The MINFINE signal is high whenever the first tap of the delay line 220' has been selected by the multiplexer 222. Thus, whenever both the fine delay circuit 154 and the coarse delay circuit 154 have reached their minimum delay values, the NOR gate 352 is disabled. As explained below, disabling the NOR gate 352 prevents the counter 350 from being further decremented since the minimum delay for the variable delay circuit 152 has been reached.

Similarly, the NOR gate 358 receives the output of inverter 366 which, in turn, receives the output of a NAND gate 368. The NAND gate 368 receives a maximum coarse signal MAX_CRSE and a maximum fine signal MAXFINE. The MAX_CRSE signal is high whenever the coarse delay circuit 158 is operating at its maximum delay. The MAXFINE signal is high whenever the last tap of the delay line 220 has been selected by the multiplexer 222. Thus, whenever both the fine delay circuit 154 and the coarse delay circuit 158 have reached their maximum delay values, the NOR gate 358 is disabled. Disabling the NOR gate 358 prevents the counter 350 from being further incremented, since the maximum delay for the variable delay circuit 152 has been reached.

The NOR gates 352, 358 also each receive a COUNT* signal that is also applied to the counter 350 by other circuitry in the phase control circuit 224. Assuming that either of the NOR gates 352, 358 is enabled, the COUNT* signal triggers a one shot 370 that outputs a positive—going pulse in causes and inverter 372 to output a negative—going pulse. As explained below, these pulses cause the counter 350 to increment or decremented depending upon the whether UP is high or low, respectively.

The counter 350 includes four count stages 380–386. All of these stages are substantially identical to each other except that the last stage 386 does not include circuitry for controlling a subsequent stage. The first stage 380 includes a latch 382 for by a pair of inverters connected input-to-output. The output of the latch 382 is coupled through an inverter 384 to a pass gate 386. The other terminal of the pass gate 386 is coupled to a second pass gate 388 by a latch 390, also formed by a pair of inverters connected input—to—output. The pass gates 386, 388 are alternately enabled so that the pass gate 386 is enabled and the pass gate 388 is disabled until the pulse generator 370 is triggered.

During an initialization procedure, an active low RESET* signal is applied to the counter 350 to cause an inverter 392 to output a high. The high at the output of the inverter 392 turns ON an NMOS transistor 396 in each of the stages 380–386. When the NMOS transistor 396 turns ON, it pulls the input to the latch 382 low thereby setting its output high and the output of the inverter 384 low. Thus, upon being reset, the count R<3:0> of the counter 350 is "0000".

When the pulse generator 370 is triggered, the pass gate 388 is turned ON thereby coupling the output of the latch 390 to the input of the latch 382. Since the output R<0> of the counter stage 380 is initially "0", the output of the latch 390 is initially "1". When the pass gate 388 is turned ON, the latch 382 changes state, and the output of the counter stage 380 transistors to "1", thereby causing the output of the latch 390 to transition to "0". Similarly, when the pulse generator 370 is once again triggered, the low at the output of the latch 390 causes the output of the latch 382 to transition to "1" thereby causing the output of the counter stage 380 to once again transition to "0". Thus, each time the output of the latch 390 is coupled to the input of the latch 382 responsive to the triggering of the pulse generator 370, the counter stage 380 toggles.

The counter stage 380 also includes circuitry for controlling the subsequent counter stage 382. When UP is high, an NMOS transistor 400 and a PMOS transistor 402 are turned ON, and a PMOS transistor 404 and an NMOS transistor 406 are turned OFF. Whenever the output of the counter stage 380 is high, an NMOS transistor 410 is turned ON and a PMOS transistor 412 is turned OFF. As a result, the input to an inverter 416 is driven low, thereby causing the inverter 416 to output a high that turns ON a pass gate 418. When the pass gate is turned ON, the counter stage 382 toggles responsive to each pulse generated by the pulse generator 370. Thus, when each stage 380–384 outputs a "1", that stage toggles to a "0" and the subsequent stage 382–386 is allowed to toggle responsive to each pulse from the pulse generator 370. As result, the count R<3:0> of the counter 350 increments with each pulse from the pulse generator 370.

In a similar manner, when UP is low, a PMOS transistor 420 is turned ON and an NMOS transistor 422 is turned on. Whenever the output of the counter stage 380 is low, the output of the latch 390 is high. The high output of the latch 390 turns ON an NMOS transistor 424 and turns OFF a PMOS transistor 426. As a result, the input to an inverter 416 is driven low, thereby turning ON the pass gate 418. Thus, when each stage 380–384 outputs a "0", that stage toggles to a "1" and the subsequent stage 382–386 is allowed to toggle responsive to each pulse from the pulse generator 370. As result, the count R<3:0> of the counter 350 decrements with each pulse from the pulse generator 370.

Each of the remaining stages 382–386 operate in essentially the same manner as the stage 380 except that the final stage 386 does not include the transistors for enabling a pass gate in a subsequent stage. Thus, the counter 350 is able to increment or decrement the delay of the fine delay circuit 154 by either incrementing or decrementing responsive to the COUNT* signal depending upon whether UP is high or low, respectively.

The UP signal is also applied to a latch 380 through a pass gate 482. The pass gate 482 is normally ON except when a flip-flop 486 formed by a pair of NAND gates 488, 490 is set. The flip-flop 486 is set whenever the pulse generator 370 is triggered, thereby causing the inverter 372 to apply a low to the NAND gate 488. The pulse from the pulse generator 370 is also applied to a NAND gate 492 through a delay circuit 496. At the trailing edge of the pulse from the pulse generator 370, the output of the inverter 372 goes high. After the high propagates through the delay circuit 496, it causes the NAND gate 494 to output a low thereby resetting the flip-flop 486. Resetting the flip-flop 486 once again couples the UP signal to the latch 482. Thus, the UP signal is continuously applied to the latch 482 except when it is blanked responsive to triggering of the pulse generator 370.

Blanking the UP signal from the latch 482 responsive to each pulse from the pulse generator 370 prevents circuitry downstream from the latch 482 from responding during transitions of a count.

With continued reference to FIG. 7, when UP is high, a NOR gate 500 is enabled, and when UP is low, a NAND gate 502 is enabled. The NAND gate 502 receives the MAXFINE signal, which is generated by a NAND gate 506 and an inverter 508. The NAND gate 506 decodes a count of "1111" corresponding to the maximum count of the counter 350. Thus, whenever the counter 350 is incrementing and the maximum count of "1111" is reached, the NAND gate 502 outputs a low. The low at the output of the NAND gate 502 causes a NAND gate 510 to output a high, thereby enabling a NAND gate 512. When the NAND gate 512 is enabled, it couples a pulse generated by a pulse generator 514 through a pair of inverters 516, 518 to generate the negative—going coarse count signal CRSE_CNT*. The coarse count signal CRSE_CNT* is applied to the up/down counter 232 in the coarse delay circuit 158 along with the UP signal.

As explained below, when UP is high, the count signal CRSE_CNT* causes the up/down counter 232 (FIG. 4) to be incremented to increase the delay of applying data to the read register 192 (FIGS. 1 and 3).

In a similar manner, when the NOR gate 500 is enabled responsive to UP being low, the NOR gate 500 outputs a high responsive to receiving a low MINFINE* signal. The MINFINE* signal is generated by a NOR gate 520 and an inverter 522. The NOR gate 520 decodes a count of "0000" corresponding to the minimum count of the counter 350. Thus, whenever the counter 350 is decrementing and the minimum count of "0000" is reached, the NOR gate 520 outputs a high that is inverted by the inverter 522. The high at the output of the NOR gate 500 is coupled to the NAND gate 510 through in inverter 526. The high output of the NOR gate 500 also causes the NAND gate 510 to output a high, thereby enabling the NAND gate 512. A pulse generated by a pulse generator 514 then also generates the negative—going coarse count signal CRSE_CNT*. As explained below, when UP is low, the count signal CRSE_CNT* causes the up/down counter 232 (FIG. 4) to be decremented to decrease the delay of applying data to the read register 192 (FIGS. 1 and 3).

Thus, the coarse count signal CRSE_CNT* causes the coarse delay circuit 158 to make a coarse delay adjustment any time the minimum count "0000" or the maximum count "1111" of the counter 350 is reached. The direction of the coarse delay adjustment is determined by the logic level of the CRSE_UP signal. Since the count R<3:0> of the counter 350 is applied to the multiplexer 222' (FIG. 5) to select one of the delay line taps, a coarse delay adjustment is made responsive to either the first or the last tap of the delay line to 220' being selected.

Figure 8:
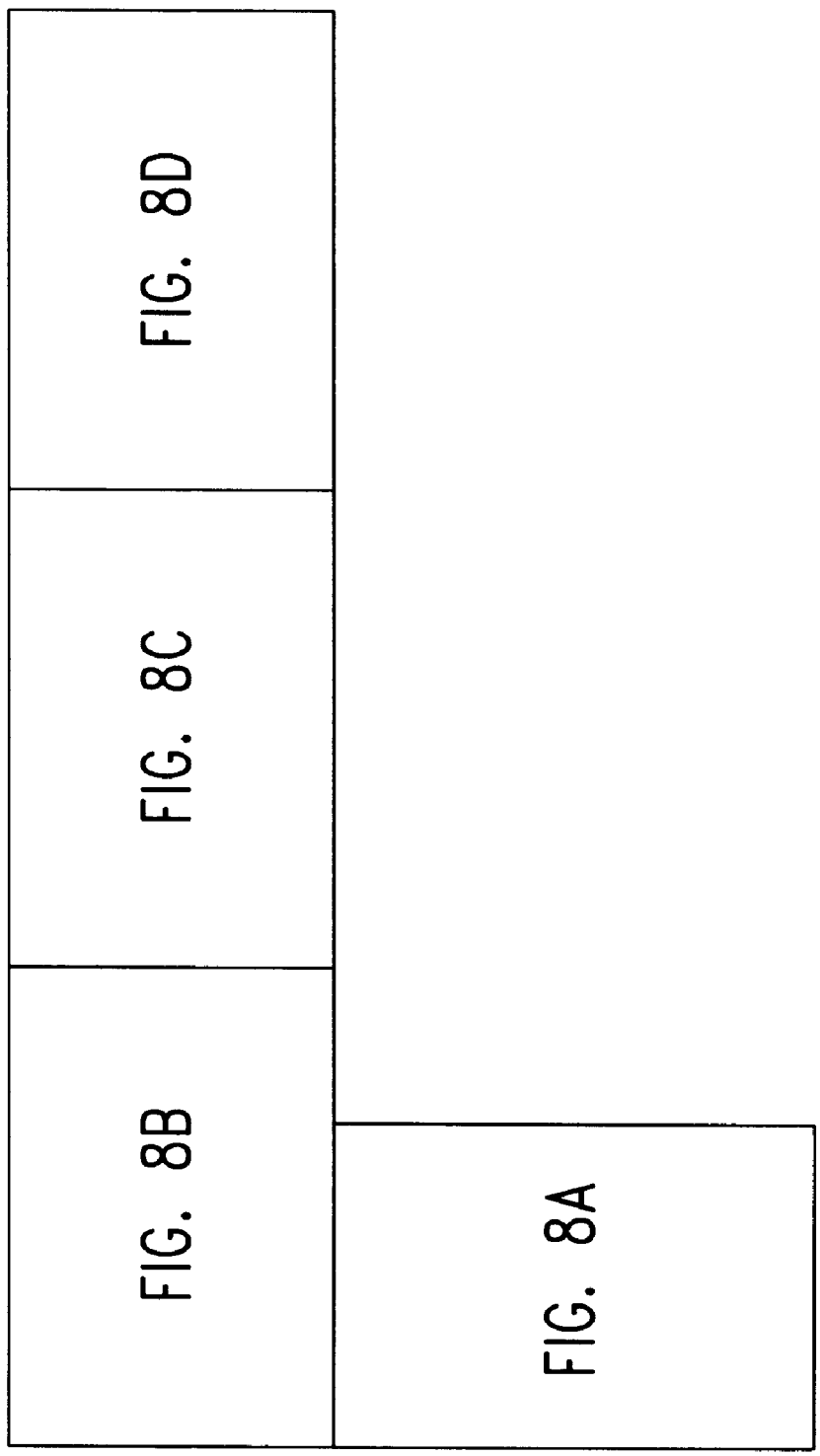
FIG. 8 is a logic diagram of a coarse delay circuit and a circuit for controlling the operation of the coarse delay circuit used in the memory device of FIG. 4.
Figure 8A:
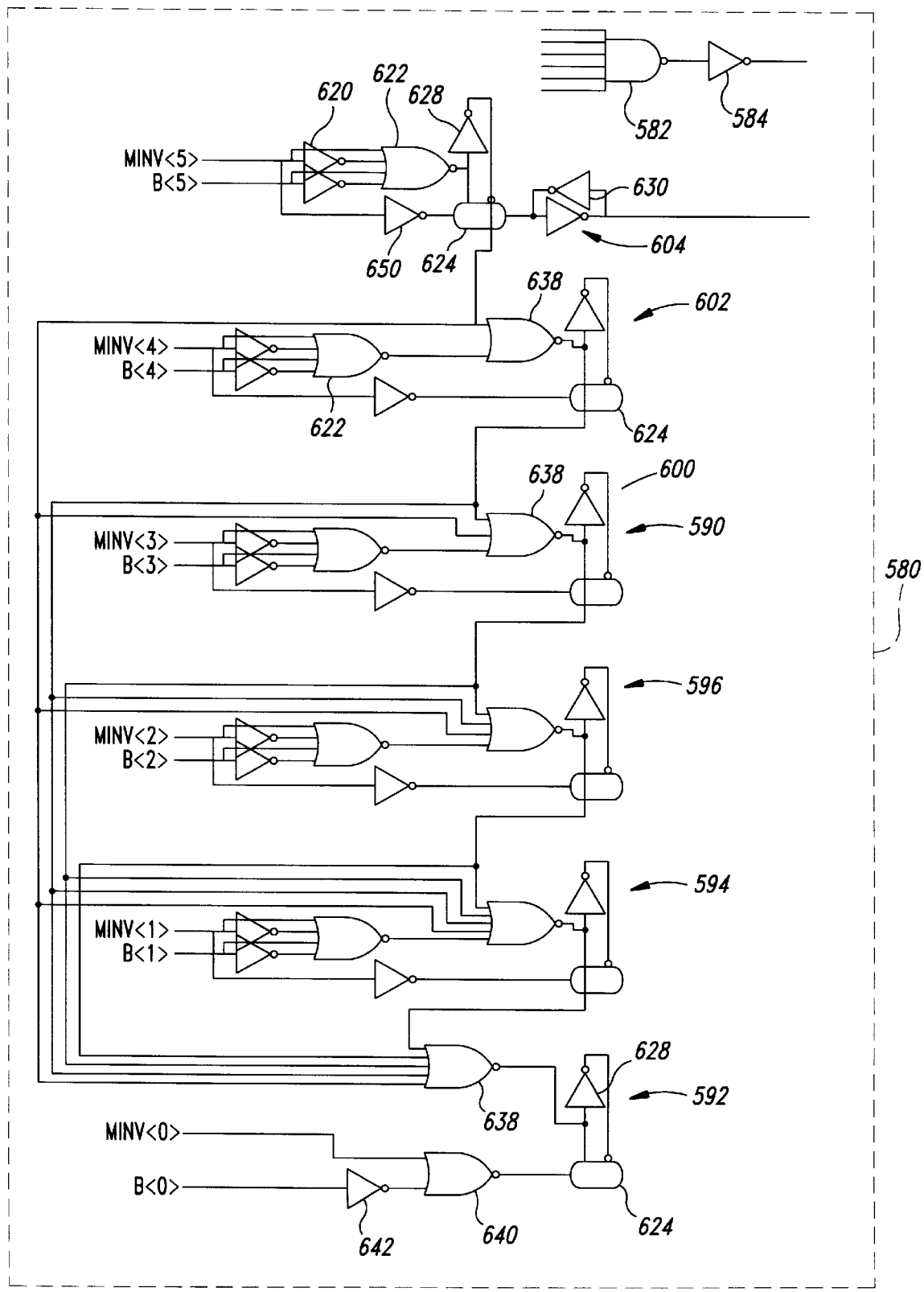
Figure 8B:
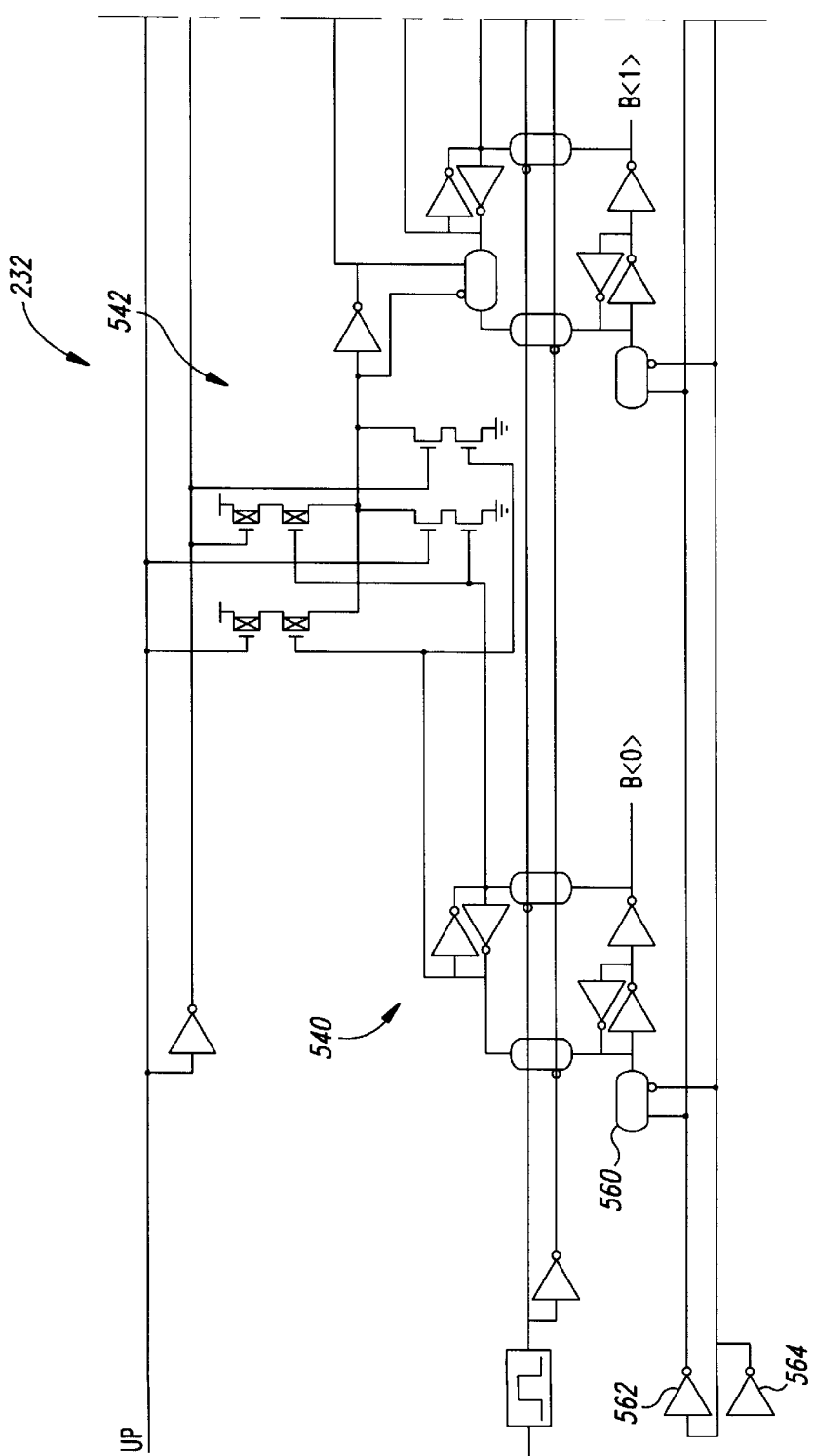
Figure 8C:
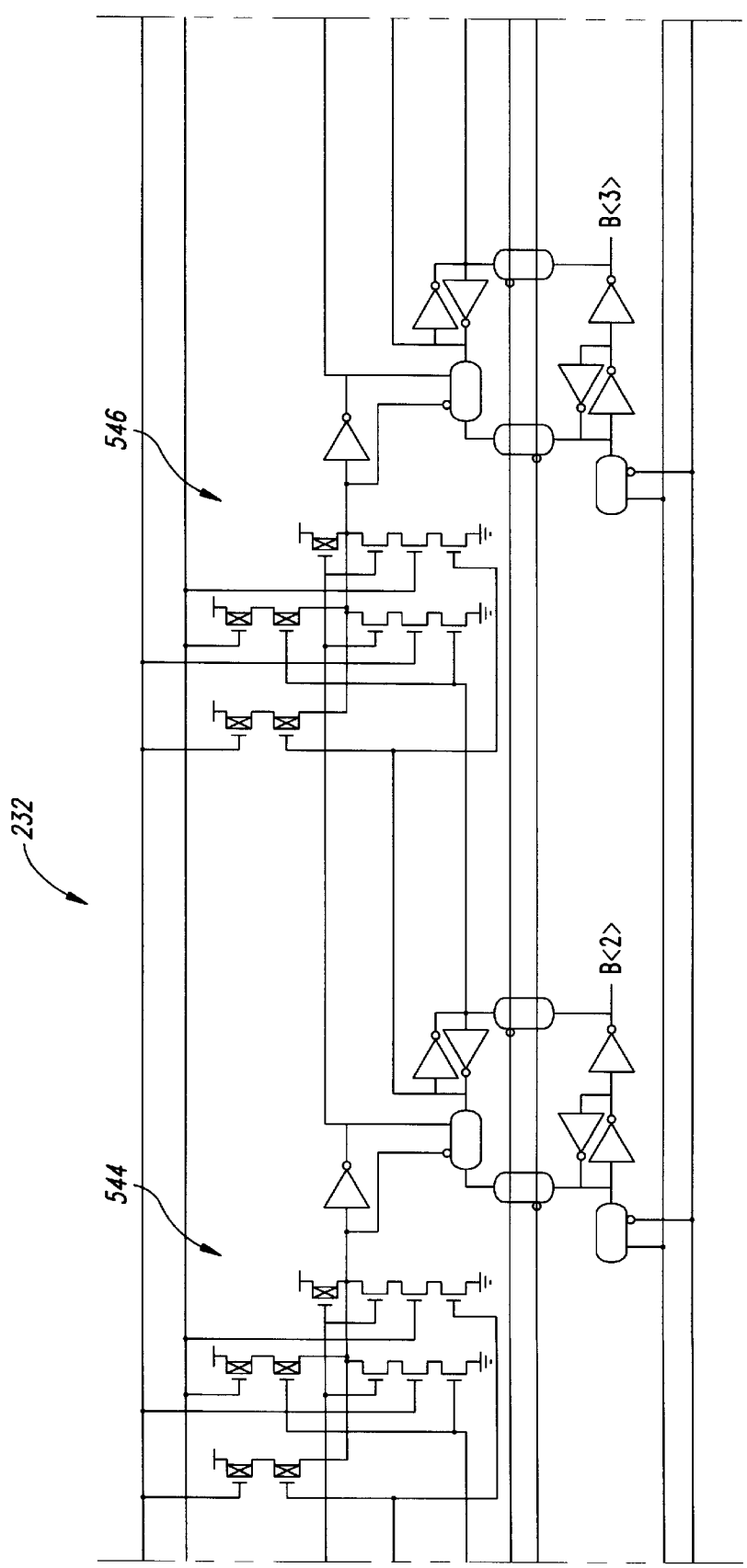
Figure 8D:
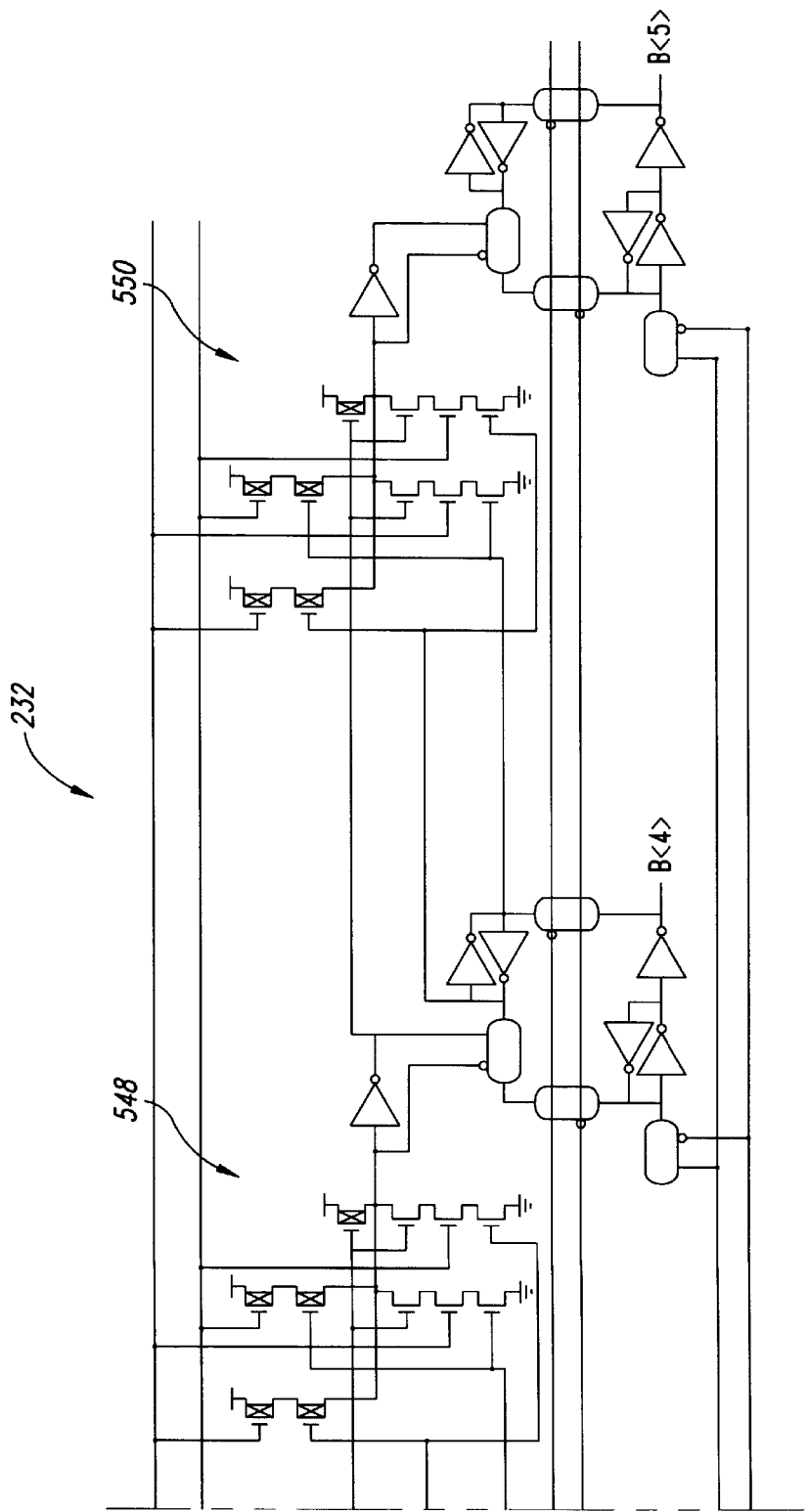

The up/down counter 232 (FIG. 4) is shown in FIG. 8. The up/down counter 232 includes six counter stages 540–550. Each of the stages 540–550 operates in the same manner as the counter stages 380–386 except in the manner in which the counter stages 542–550 are initially loaded. Rather than being reset as are the counter stages 380–386, the counter stages 540–550 are initially preloaded with an initial count Y<5:0>. This initial count Y<5:0> is normally a part of the command packet CA and is coupled to the counter 232 from the storage register 204 (FIG. 4).

With reference to the first stage 540, a respective bit of the initial count Y<0> is applied to the input of a latch in the counter stage 540 through a pass gate 560. The past gate 560 is selectively enabled by a LOAD pulse applied through a pair of inverters 562, 564. Thus, in response to the LOAD pulse, the initial count Y<5:0> is loaded into the counter 232.

The coarse delay circuit 158 also includes a decoder circuit 580 that determines when in the counter 232 has reached the maximum count. All of the outputs B<5:0> of the counter are applied to a NAND gate 582, which outputs a low when the count B<5:0> of the counter 232 is "1111". The low at the output of the NAND gate 582 causes an inverter 584 to output the high maximum coarse delay signal MAX_CRSE.

The decoder circuit 580 also includes a comparison circuit 590 for generating the minimum coarse delay signal MIN_CRSE based on the count B<5:0> of the counter and a minimum delay word MINV<5:0>. The minimum delay word MINV<5:0>, which is generated by other circuitry in the memory device 10, corresponds to the minimum time in which the memory device is capable of coupling read data from the memory array 180 (FIG. 3) to the read register 192. The function of the comparison circuit 590 is to generate the MIN_CRSE signal whenever the count B<5:0> is less than or equal to MINV<5:0>. Thus, if any bit of MINV is a "1" and the corresponding bit of B is a "0", then a high MIN_CRSE signal is generated.

With reference to the sixth comparison stage 604, the MINV<5> and B<5> bits are applied through a pair of inverters 620 to an exclusive NOR gate 622. The exclusive NOR gate 622 outputs a high in the event of a match between MINV<5> and B<5>. Since the exclusive NOR gate 622 is coupled to a pass gate 624 directly and through in inverter 628. a high at the output of the exclusive NOR gate 622 turns OFF the pass gate 624. As a result, the sixth comparison stage 604 does not apply any signal to an output latch 630 formed by a pair of input—to—output connected inverters whenever there is a match between MINV<5> and B<5>.

The fifth comparison stage 602 is substantially identical in structure and operation to the sixth comparison stage 604 except for the inclusion of a NOR gate 638. The NOR gate 638 is enabled by the low at the output of the inverter 628 whenever there is a match between MINV<5> and B<5> for the reasons explained above. Enabling the NOR gate 638 allows the fifth stage 602 to operate in the same manner as the sixth stage 604 except that the high at the output of the exclusive or gate 622 is coupled to the pass gate 624 as a low, and the pass gate 624 is disabled by a low rather than by a high as in the pass gate 624 of the sixth stage 604. Thus, in the event of a match between MINV<4> and B<4>, the fifth stage 602 does not apply a signal to the latch 630, and the low at the output of the NOR gate 638 enables a similar NOR gate 638 in the third stage 600.

In summary, in the event of a match between the compared bit of MINV and B in each stage, that stage does not apply any signal to the latch 630, and it enables the next lower stage. All of the comparison stages 594–604 operate in this manner except for the first comparison stage 592. Rather than using an exclusive NOR gate 622, the first stage 592 uses a NOR gate 640 to which MINV<0> is applied directly and B<0> is applied through an inverter 642. In the event of a match between MINV<5:0> and B<5:0>, the NOR gate 638 in the first stage 592 receives a low at all of its inputs thereby causing the NOR gate 638 to output a low that turns ON the pass gate 624. Thus, the pass gate 624 will be ON if the pass gates 624 in all of the other stages 594–604 are all OFF responsive to a match between the compared bits of MINV and B.

The output of the NOR gate 640 will be low to cause the latch 630 to output a high MIN_CRSE signal except for when MINV<0> is low and B<0> is high, i.e. the count B<5:0> is higher than MINV<5:0>. Thus, when B<5:0> is less than or equal to MINV<5:0>, the MIN_CRSE signal will be high. When MINV<0> is low and B<0> is high, i.e. the count B<5:0> is higher than MINV<5:0>, the MIN_CRSE signal will be low.

The above discussion explains the operation of the comparison circuit 580 when there is a match between MINV<5:1> and B<5:1> and there may or may not be a match between MINV<0> and B<0>. The following discussion explains the operation of the comparison circuit 580 when there is not a match between at least one of the bits of MINV<5:1> and B<5:1>.

With reference to the fifth stage 604, if there is not a match between MINV<5> and B<5>, the output of the exclusive NOR gate 622 is low, thereby enabling the pass gate 624. As a result, the complement of MINV<5> is coupled through an inverter 650 to the pass gate 624. If MINV<5> is "1" and B<0> is "0", then B<5> must be less than MINV<5:0> since the most significant bit of B<5:0> is less than MINV<5:0>. Under these circumstances, the inverter 650 outputs a low that causes the latch 630 to output a high MIN_CRSE signal.

The only other combination of MINV<5> and B<5> is where MINV<5> is "0" and B<5> is "1" since, because there is no match between MINV<5> and B<5>, MINV<5> and B<5> cannot both be "0" or "1". If MINV<5> is "0" and B<5>, the count B<5:0> must be greater than MINV<5:0>. Under these circumstances, the low value of MINV<5> causes the inverter 650 to output a high, thereby causing the latch 630 to output a low MIN_CRSE signal.

The other comparisons stages 592–602 operate in the same manner. Therefore, whenever any bit of B<5:0> is less than the corresponding bit of MINV<5:0>, the latch 630 outputs an active high MIN_CRSE signal. Whenever any bit of B<5:0> is greater than the corresponding bit of MINV<5:0>, the latch 630 outputs an inactive low MIN_CRSE signal.

As mentioned above, the variable delay circuit 152 of FIGS. 2–5 may be used in the memory device 10 of FIG. 1 to provide optimum performance at high operating speeds.

In using the variable delay circuit 152 in the memory device 10, the fine delay circuit 154 and the fine delay control circuit 156 would be part of the clock generator 40 (FIG. 1) that generates the internal clock signal ICKL, the write clock signal WCLK, and the read clock signal RCLK. The coarse delay circuit 158 and the coarse delay control circuit 160 would be part of the command decoder and sequence 60 that generates the control signals for the memory array 180. The manner in which these components would be implemented in the conventional memory device 10 of FIG. 1 will be apparent to one of ordinary skill in the art, and an explanation will therefore be omitted in the interest of brevity.

In addition to using the variable delay circuit 152 to control the timing at which read data may be coupled to the data bus 130 of the memory device 10, the variable delay circuit 152 may be used to control the timing at which the data clock DCLK is applied to the data clock bus 132. In particular, the timing information for the data clock DCLK signal would be applied to the memory device 10 from the external device, and the memory device would use the fine delay circuit 152 to make small adjustments in the timing of the data clock signal DCLK. The coarse delay circuit 158 would be used in connection with a counter to make small adjustments in the timing of the data clock signal DCLK.

Figure 9:
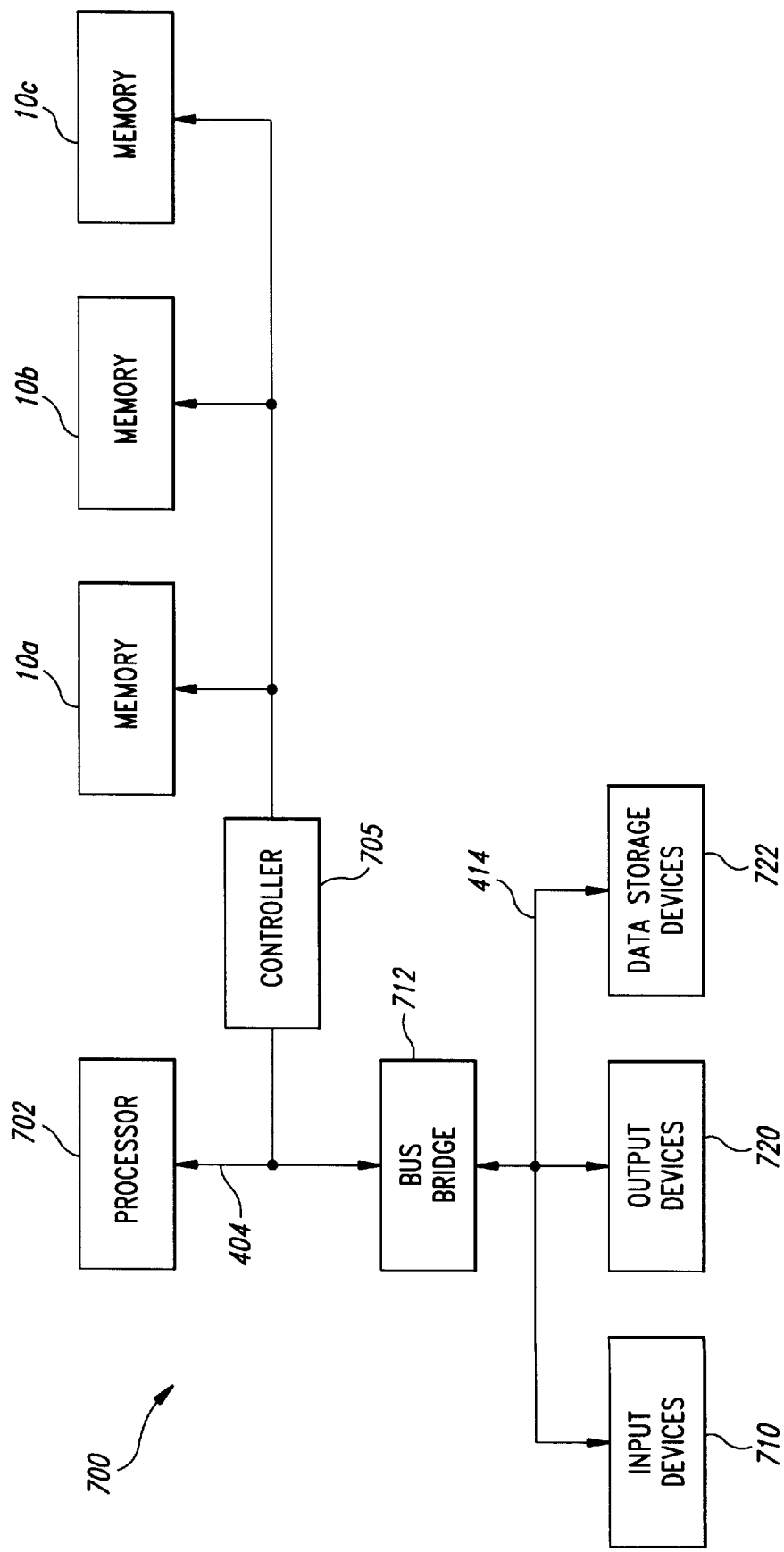
FIG. 9 is a block diagram of a computer system using a plurality of the memory devices of FIG. 1 containing the variable delay circuit of FIGS. 3–4.

A computer system using the variable delay circuit 152 in each of a plurality of the memory devices 10 shown in FIG. 1 is shown in FIG. 9. With reference to FIG. p the computer system 700 includes a processor 702 having a processor bus 704 coupled through a memory controller 705 to three memory devices which may be packetized dynamic random access memory or SyncLink DRAMs ("SLDRAM") 10a–c.

The computer system 700 also includes one or more input devices 701, such as a keypad or a mouse, coupled to the processor 702 through a bus bridge 712 and an expansion bus 714, such as an industry standard architecture ("ISA") bus or a Peripheral component interconnect ("PCI") bus. The input devices 710 allow an operator or an electronic device to input data to the computer system 400. One or more output devices 720 are coupled to the processor 702 to display or otherwise output data generated by the processor 702. The output devices 720 are coupled to the processor 702 through the expansion bus 714, bus bridge 712 and processor bus 704. Examples of output devices 702 include printers and video display units. One or more data storage devices 722 are coupled to the processor 702 through the processor bus 704, bus bridge 712, and expansion bus 714 to store data in or retrieve data from storage media (not shown). Examples of storage devices 722 and storage media include fixed disk drives floppy disk drives, tape cassettes and compact-disk read-only memory devices.

In operation, the processor 702 communicates with the memory devices 10a–c via the memory controller 705. The memory controller 705 sends the memory devices 10a–c command packets that contain both control and address information. Data is coupled between the processor 702 and the memory devices 10a–c, through the memory controller 705 and a data bus portion of the processor bus 704. The memory controller 705 applies write data from the processor 702 to the memory devices 10a–c, and it applies read data from the memory devices 10a–c to the processor 702. In reading data from the memory devices 10a–c, the memory controller 705 also provides the memory devices 10a–c with timing information to adjust the timing of the read data and/or data clock. Although all the memory devices 10a–c are coupled to the memory controller 705, only one memory device 10a–c at a time reads or writes data, thus avoiding bus contention. Bus contention is avoided by each of the memory devices 10a–c and the bus bridge 712 having a unique identifier, and the command packet contains an identifying code that selects only one of these components.

The computer system 700 also includes a number of other components and signal lines which have been omitted from FIG. 9 in the interests of brevity. For example, as explained above, the memory devices 10a–c also receive a command or master clock signal to provide internal timing signals, and a data clock signal clocking data into and out of the memory device 10.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A variable delay circuit generating an output signal having a controlled timing, the variable delay circuit comprising:

a fine delay circuit receiving a clock signal and generating a delayed clock signal, the delayed clock signal having a delay relative to the clock signal that corresponds to a fine delay control signal applied to a control input of the fine delay circuit, the delay corresponding to the fine delay control signal being greater than a predetermined minimum delay and less than a predetermined maximum delay;

a coarse delay circuit controlling the timing of a digital signal relative to the clock signal in delay increments responsive to a coarse delay control signal applied to a control input of the coarse delay circuit; and a control circuit receiving a signal indicative of the delay of the fine delay circuit, the control circuit generating the coarse delay control signal to change the timing of the digital signal in one direction responsive to the delay of the fine delay circuit being within a predetermined range of the predetermined minimum delay, the control circuit generating the coarse delay control signal to change the timing of the digital signal in the opposite direction responsive to the delay of the fine delay circuit being within a predetermined range of the predetermined maximum delay; and a combining circuit for combining the delayed clock signal with the digital signal to provide the output signal having a timing corresponding to the combined delay of the fine delay circuit and the coarse delay circuit.

2. The variable delay circuit of claim 1, wherein the fine delay circuit adjusts the delay of the delayed clock signal relative to the clock signal in increments.

3. The variable delay circuit of claim 1, wherein the clock signal is a periodic signal, and wherein the fine delay circuit adjusts the delay of the delayed clock signal relative to the clock signal in phase increments.

4. The variable delay circuit of claim 3, wherein each of the phase increments is 180/N degrees, where N is the number of phase increments.

5. The variable delay circuit of claim 3, wherein the predetermined minimum delay is within a first range of a zero degree phase shift and the predetermined maximum delay is within a second range of a 180 degree phase shift.

6. The variable delay circuit of claim 5, wherein first and second ranges are each zero degrees.

7. The variable delay circuit of claim 1, wherein the clock signal is a periodic signal, and wherein each of the fixed delay increments is the product of N and 180 degrees.

8. The variable delay circuit of claim 7, wherein N is 1 so that each of the fixed delay increments is 180 degrees.

9. The variable delay circuit of claim 1, wherein the signal received by the control circuit that is indicative of the delay of the fine delay circuit comprises the fine delay control signal.

10. The variable delay circuit of claim 1, wherein the control circuit causes the coarse delay circuit to increment the delay of the coarse delay circuit responsive to the delay of the fine delay circuit reaching the predetermined maximum delay and causes the coarse delay circuit to decrement the delay of the coarse delay circuit responsive to the delay of the fine delay circuit reaching the predetermined minimum delay.

11. The variable delay circuit of claim 1, further comprising a functional circuit generating the digital signal responsive to the clock signal, the functional circuit being coupled to the coarse delay circuit, the coarse delay circuit controlling the timing of the digital signal generated by the functional circuit.

12. The variable delay circuit of claim 11, wherein the functional circuit comprises:

a preloadable counter coupled to the coarse delay control circuit, the preloadable counter generating the digital signal responsive to reaching a predetermined count, the counter being enabled to count toward the predetermined count responsive to the clock signal; and wherein the coarse control circuit causes the coarse delay control signal to load a preload count into the counter prior to the counter being enabled by the clock signal, the coarse delay control circuit incrementing or decrementing the preload count responsive to the signal indicative of the delay of the fine delay circuit.

13. The variable delay circuit of claim 12, wherein the coarse control circuit comprises an up/down counter, the up/down counter generating a count corresponding to the preload count, the up/down counter being incremented responsive to the delay of the fine delay circuit reaching one of the predetermined maximum or minimum delays, the up/down counter being decremented responsive to the delay of the fine delay circuit reaching the other of the predetermined maximum or minimum delays.

14. The variable delay circuit of claim 11, wherein the functional circuit comprises:

a memory command generator generating control signals for a memory device, the command generator including a preloadable counter coupled to the coarse delay control circuit, the preloadable counter generating the digital signal to control the operation of the memory device responsive to reaching a predetermined count, the counter being enabled to count toward the predetermined count responsive to the clock signal; and wherein the coarse control circuit comprises:

an up/down counter coupled to the preloadable counter, the up/down counter generating a preload count and loading the preload count into the preloadable counter prior to the counter being enabled by the clock signal, the up/down counter being incremented responsive to the delay of the fine delay circuit reaching one of the predetermined maximum or minimum delays, the up/down counter being decremented responsive to the delay of the fine delay circuit reaching the other of the predetermined maximum or minimum delays.

15. The variable delay circuit of claim 1, wherein the fine delay circuit comprises:

a tapped delay line having an input terminal receiving the clock signal, the delay line generating a plurality of increasingly delayed output signals at a plurality of respective output terminals; and a multiplexer coupled to the outputs of the delay line, the multiplexer selecting one of the delay line output signals for use as the delayed clock signal responsive to the fine delay control signal.

16. The variable delay circuit of claim 1, wherein the combining circuit comprises a register receiving the digital signal at a data input and receiving the delayed clock signal at a clock input, the register coupling the digital signal to an output terminal as the output signal responsive to the delayed clock signal.

17. A command generator for memory device, the command generator outputting a control signal for the memory device to cause the memory device to output read data from a memory array responsive to an enable signal synchronized to a clock signal, the command generator comprising:

a fine delay circuit receiving the clock signal, the fine delay circuit generating a delayed clock signal having a delay relative to the clock signal corresponding to a fine delay control signal applied to a control input of the fine delay circuit, the delay corresponding to the fine delay control signal being greater than a predetermined minimum delay and less than a predetermined maximum delay;

a first control circuit generating the fine delay control signal as a function of a timing command;

a preloadable counter generating the control signal responsive to reaching a predetermined count, the counter being enabled to count toward the predetermined count responsive to the clock signal; and an up/down counter coupled to the preloadable counter, the up/down counter generating a preload count and loading the preload count into the preloadable counter prior to the counter being enabled by the clock signal, the up/down counter being incremented responsive an increment signal and being decremented responsive to a decrement signal; and a second control circuit generating the increment signal responsive to the delay of the fine delay circuit reaching one of the predetermined maximum or minimum delays, the second control circuit generating the decrement signal responsive to the delay of the fine delay circuit reaching the other of the predetermined maximum or minimum delays; and a read data register having a data input terminal coupled to the memory array to receive read data from the memory array, a data output terminal coupled to an externally accessible data bus terminal of the memory device, and a clock input receiving the delayed clock signal from the fine delay circuit, the read data register coupling data from the data input terminal to the data output terminal of the read data register responsive to the delayed clock signal.

18. The command generator of claim 17, wherein the fine delay circuit adjusts the delay of the delayed clock signal relative to the clock signal in increments.

19. The command generator of claim 17, wherein the clock signal is a periodic signal, and wherein the fine delay circuit adjusts the delay of the delayed clock signal relative to the clock signal in phase increments.

20. The command generator of claim 19, wherein each of the phase increments is 180/N degrees, where N is the number of phase increments.

21. The command generator of claim 19, wherein the predetermined minimum delay is within a first range of a zero degree phase shift and the predetermined maximum delay is within a second range of a 180 degree phase shift.

22. The command generator of claim 17, wherein the clock signal is a periodic signal, and wherein each of the fixed delay increments is the product of N and 180 degrees.

23. The command generator of claim 22, wherein N is 1 so that each of the fixed delay increments is 180 degrees.

24. The command generator of claim 17, wherein the fine delay circuit comprises:

a tapped delay line having an input terminal receiving the clock signal, the delay line generating a plurality of increasingly delayed output signals at a plurality of respective output terminals; and a multiplexer coupled to the outputs of the delay line, the multiplexer selecting one of the delay line output signals for use as the delayed clock signal responsive to the fine delay control signal applied to the multiplexer by the first control circuit.

25. A memory device, comprising:

a clock generator circuit receiving an external clock signal applied to a first externally accessible terminal and generating an internal clock signal having a phase shift relative to the external clock signal corresponding to a phase command signal applied to a control input of the clock generator circuit, the phase shift corresponding to the phase command signal being greater than a predetermined minimum phase and less than a predetermined maximum phase;

at least one array of memory cells adapted to store write data to and output read data from a location determined by a row address and a column address applied to respective other of the terminals;

a row address circuit adapted to receive and decode the row address, and select a row of memory cells corresponding to the row address;

a column address circuit adapted to receive read data from or apply write data to one of the memory cells in the selected row corresponding to the column address;

a command buffer receiving externally generated memory commands, the command buffer generating control signals responsive to the memory commands to control an operation of the memory device;

a data path circuit adapted to couple data between an externally accessible terminal of the memory device and the column address circuit, the data path circuit including a read register adapted to receive read data from the column address circuit and couple the read data to a data bus terminal responsive to the internal clock signal applied to a clock input of the read register;

a first control circuit generating the phase command signal as a function of a timing command signal; and a timer circuit controlling the timing of the read data being applied to the read register in fixed delay increments responsive to a signal indicative of the phase shift of the clock generator circuit, the timer circuit changing the timing of the read data applied to the read register in one direction responsive to the phase shift of the clock generator circuit being within a predetermined range of the predetermined minimum phase and in an opposite direction responsive to the phase shift of the clock generator circuit being within a predetermined range of the predetermined maximum phase.

26. The memory device of claim 25, wherein the command buffer comprises:

a preloadable counter generating the control signal responsive to reaching a predetermined count, the counter being enabled to count toward the predetermined count responsive to the external clock signal; and wherein the timer circuit comprises:

an up/down counter coupled to the preloadable counter, the up/down counter generating a preload count and loading the preload count into the preloadable counter prior to the counter being enabled by the external clock signal, the up/down counter being incremented responsive to the phase shift of the clock generator circuit reaching one of the predetermined maximum or minimum phases and being decremented responsive to the phase shift of the clock generator circuit reaching the other of the predetermined maximum or minimum phases.

27. The memory device of claim 25, wherein the clock generator circuit adjusts the phase of the internal clock signal relative to the external clock signal in phase increments.

28. The memory device of claim 25, wherein the clock generator circuit comprises:

a tapped delay line having an input terminal receiving the external clock signal, the delay line generating a plurality of increasingly delayed output signals at a plurality of respective output terminals; and a multiplexer coupled to the outputs of the delay line, the multiplexer selecting one of the delay line output signals for use as the internal clock signal responsive to the phase command signal applied to the multiplexer by the first control circuit.

29. The memory device of claim 25, wherein the clock generator circuit comprises:

a tapped delay line having an input terminal receiving the external clock signal, the delay line generating a plurality of increasingly delayed output signals at a plurality of respective output terminals; and a multiplexer coupled to the outputs of the delay line, the multiplexer selecting one of the delay line output signals for use as the internal clock signal responsive to the phase command signal applied to the multiplexer by the first control circuit;

wherein the command buffer comprises:

a preloadable counter generating the control signal responsive to reaching a predetermined count, the counter being enabled to count toward the predetermined count responsive to the external clock signal; and wherein the timer circuit comprises:

an up/down counter coupled to the preloadable counter, the up/down counter generating a preload count and loading the preload count into the preloadable counter prior to the counter being enabled by the external clock signal, the up/down counter being incremented responsive to the multiplexer selecting a first delay line output signal for use as the internal clock signal and being decremented responsive to the multiplexer selecting a second delay line output signal for use as the internal clock signal.

30. A memory device, comprising:

at least one array of memory cells adapted to store data at a location determined by a row address and a column address applied to respective other of the terminals;

a row address circuit adapted to receive and decode the row address, and select a row of memory cells corresponding to the row address;

a column address circuit adapted to receive or apply data to one of the memory cells in the selected row corresponding to the column address;

a data path circuit including a write data register adapted to couple data from an externally accessible data bus terminal to the column address circuit, the data path circuit further including a read data register adapted to couple from the column address circuit to the externally accessible data bus terminal responsive to a read data clock signal;

a shift register receiving a plurality of command bits responsive to a clock signal derived from an external clock signal;

a timing control signal generating a count start signal responsive to a flag signal and a clock signal derived from an external clock signal applied to an externally accessible clock terminal;

a preloadable command counter causing data to be read from the memory array and applied to the read data register responsive to reaching a predetermined count, the counter being enabled to count toward the predetermined count responsive to the count start signal;

a clock generator circuit receiving the external clock signal and generating the read data clock signal having a phase shift relative to the external clock signal corresponding to a phase command signal applied to a control input of the clock generator circuit, the phase shift corresponding to the phase command signal being greater than a predetermined minimum phase and less than a predetermined maximum phase;

a first control circuit generating the phase command signal as a function of the phase relationship between the read data clock signal and the read data applied to the read data register;

an up/down counter coupled to the preloadable counter, the up/down counter generating a preload count and loading the preload count into the preloadable counter prior to the counter being enabled by the count start signal, the up/down counter being incremented responsive to the phase shift of the clock generator circuit reaching one of the predetermined maximum or minimum phases and being decremented responsive to the phase shift of the clock generator circuit reaching the other of the predetermined maximum or minimum phases.

31. The memory device of claim 30, wherein the clock generator circuit comprises:

a tapped delay line having an input terminal receiving the external clock signal, the delay line generating a plurality of increasingly delayed output signals at a plurality of respective output terminals; and a multiplexer coupled to the outputs of the delay line, the multiplexer selecting one of the delay line output signals for use as the read data clock signal responsive to the phase command signal applied to the multiplexer by the first control circuit.

32. The memory device of claim 31, wherein the up/down counter is incremented responsive to the multiplexer selecting a first delay line output signal for use as the read data clock signal and being decremented responsive to the multiplexer selecting a second delay line output signal for use as the read data clock signal.

33. A computer system, comprising:

a processor having a processor bus;

an input device coupled to the processor through the processor bus adapted to allow data to be entered into the computer system;

an output device coupled to the processor through the processor bus adapted to allow data to be output from the computer system; and a dynamic random access memory coupled to the processor bus adapted to allow data to be stored, adapted to receive a plurality of input signals and generate a plurality of output signals on respective, externally accessible terminals, the dynamic random access memory comprising:

a clock generator circuit receiving an external clock signal applied to a first externally accessible terminal and generating an internal clock signal having a phase shift relative to the external clock signal corresponding to a phase command signal applied to a control input of the clock generator circuit, the phase shift corresponding to the phase command signal being greater than a predetermined minimum phase and less than a predetermined maximum phase;

at least one array of memory cells adapted to store write data to and output read data from a location determined by a row address and a column address applied to respective other of the terminals;

a row address circuit adapted to receive and decode the row address, and select a row of memory cells corresponding to the row address;

a column address circuit adapted to receive read data from or apply write data to one of the memory cells in the selected row corresponding to the column address;

a command buffer receiving externally generated memory commands, the command buffer generating control signals responsive to the memory commands to control an operation of the memory device;

a data path circuit adapted to couple data between an externally accessible terminal of the memory device and the column address circuit, the data path circuit including a read register adapted to receive read data from the column address circuit and couple the read data to a data bus terminal responsive to the internal clock signal applied to a clock input of the read register;

a first control circuit generating the phase command signal as a function of a timing command signal; and a timer circuit controlling the timing of the read data being applied to the read register in fixed delay increments responsive to a signal indicative of the phase shift of the clock generator circuit, the timer circuit changing the timing of the read data applied to the read register in one direction responsive to the phase shift of the clock generator circuit being within a predetermined range of the predetermined minimum phase and in an opposite direction responsive to the phase shift of the clock generator circuit being within a predetermined range of the predetermined maximum phase.

34. The computer system of claim 33, wherein the command buffer comprises:

a preloadable counter generating the control signal responsive to reaching a predetermined count, the counter being enabled to count toward the predetermined count responsive to the external clock signal; and wherein the timer circuit comprises:

an up/down counter coupled to the preloadable counter, the up/down counter generating a preload count and loading the preload count into the preloadable counter prior to the counter being enabled by the external clock signal, the up/down counter being incremented responsive to the phase shift of the clock generator circuit reaching one of the predetermined maximum or minimum phases and being decremented responsive to the phase shift of the clock generator circuit reaching the other of the predetermined maximum or minimum phases.

35. The computer system of claim 33, wherein the clock generator circuit adjusts the phase of the internal clock signal relative to the external clock signal in phase increments.

36. The computer system of claim 33, wherein the clock generator circuit comprises:

a tapped delay line having an input terminal receiving the external clock signal, the delay line generating a plurality of increasingly delayed output signals at a plurality of respective output terminals; and a multiplexer coupled to the outputs of the delay line, the multiplexer selecting one of the delay line output signals for use as the internal clock signal responsive to the phase command signal applied to the multiplexer by the first control circuit.

37. The computer system of claim 33, wherein the clock generator circuit comprises:

a tapped delay line having an input terminal receiving the external clock signal, the delay line generating a plurality of increasingly delayed output signals at a plurality of respective output terminals; and a multiplexer coupled to the outputs of the delay line, the multiplexer selecting one of the delay line output signals for use as the internal clock signal responsive to the phase command signal applied to the multiplexer by the first control circuit;

wherein the command buffer comprises:

a preloadable counter generating the control signal responsive to reaching a predetermined count, the counter being enabled to count toward the predetermined count responsive to the external clock signal; and wherein the command buffer timer circuit comprises:

an up/down counter coupled to the preloadable counter, the up/down counter generating a preload count and loading the preload count into the preloadable counter prior to the counter being enabled by the external clock signal, the up/down counter being incremented responsive to the multiplexer selecting a first delay line output signal for use as the internal clock signal and being decremented responsive to the multiplexer selecting a second delay line output signal for use as the internal clock signal.

38. The computer system of claim 33 wherein the memory device comprises a dynamic random access memory.

39. The computer system of claim 33 wherein the dynamic random access memory comprises a packetized dynamic random access memory.

40. A computer system, comprising:

a processor having a processor bus;

an input device coupled to the processor through the processor bus adapted to allow data to be entered into the computer system;

an output device coupled to the processor through the processor bus adapted to allow data to be output from the computer system; and a dynamic random access memory coupled to the processor bus adapted to allow data to be stored, adapted to receive a plurality of input signals and generate a plurality of output signals on respective, externally accessible terminals, the dynamic random access memory comprising:

at least one array of memory cells adapted to store data at a location determined by a row address and a column address applied to respective other of the terminals;

a row address circuit adapted to receive and decode the row address, and select a row of memory cells corresponding to the row address;

a column address circuit adapted to receive or apply data to one of the memory cells in the selected row corresponding to the column address;

a data path circuit including a write data register adapted to couple data from an externally accessible data bus terminal to the column address circuit, the data path circuit further including a read data register adapted to couple from the column address circuit to the externally accessible data bus terminal responsive to a read data clock signal;

a shift register receiving a plurality of command bits responsive to a clock signal derived from an external clock signal;

a timing control signal generating a count start signal responsive to a flag signal and a clock signal derived from an external clock signal applied to an externally accessible clock terminal;

a preloadable command counter causing data to be read from the memory array and applied to the read data register responsive to reaching a predetermined count, the counter being enabled to count toward the predetermined count responsive to the count start signal;

a clock generator circuit receiving the external clock signal and generating the read data clock signal having a phase shift relative to the external clock signal corresponding to a phase command signal applied to a control input of the clock generator circuit, the phase shift corresponding to the phase command signal being greater than a predetermined minimum phase and less than a predetermined maximum phase;

a first control circuit generating the phase command signal as a function of the phase relationship between the read data clock signal and the read data applied to the read data register;

an up/down counter coupled to the preloadable counter, the up/down counter generating a preload count and loading the preload count into the preloadable counter prior to the counter being enabled by the count start signal, the up/down counter being incremented responsive to the phase shift of the clock generator circuit reaching one of the predetermined maximum or minimum phases and being decremented responsive to the phase shift of the clock generator circuit reaching the other of the predetermined maximum or minimum phases.

41. The computer system of claim 40, wherein the clock generator circuit comprises:

a tapped delay line having an input terminal receiving the external clock signal, the delay line generating a plurality of increasingly delayed output signals at a plurality of respective output terminals; and a multiplexer coupled to the outputs of the delay line, the multiplexer selecting one of the delay line output signals for use as the read data clock signal responsive to the phase command signal applied to the multiplexer by the first control circuit.

42. The computer system of claim 41, wherein the up/down counter is incremented responsive to the multiplexer selecting a first delay line output signal for use as the read data clock signal and being decremented responsive to the multiplexer selecting a second delay line output signal for use as the read data clock signal.

43. The computer system of claim 40 wherein the memory device comprises a dynamic random access memory.

44. The computer system of claim 43 wherein the dynamic random access memory comprises a packetized dynamic random access memory.

45. A method of generating a delayed clock signal having a controlled timing relative to a digital signal, the method comprising:

generating the delayed clock signal responsive to an input clock signal, the delayed clock signal having a delay relative to the input clock signal that is adjustable over a relatively narrow range between a minimum delay value and a maximum delay value;

adjusting the timing of the delayed clock signal relative to the input clock signal;

generating the digital signal responsive to the input clock signal, the timing of the digital signal relative to the input clock signal being adjusted over a relatively broad range;

adjusting the timing of the digital signal relative to the input clock signal in one direction responsive to the delay of the delayed clock signal relative to the input clock signal approaching the minimum delay value; and adjusting the timing of the digital signal relative to the input clock signal in an opposite direction responsive to the delay of the delayed clock signal relative to the input clock signal approaching the maximum delay value.

46. The method of claim 45, wherein the step of adjusting the timing of the delayed clock signal comprises adjusting the timing of the delayed clock signal in delay increments.

47. The method of claim 45 wherein the step of generating the digital signal responsive to the input clock signal comprises:

counting from an initial count toward a terminal count; and generating the digital signal responsive to reaching the terminal count; and wherein the step of adjusting the timing of the digital signal relative to the input clock signal in one direction responsive to the delay of the delayed clock signal relative to the input clock signal approaching the minimum delay value comprises increasing one of the counts; and wherein the step of adjusting the timing of the digital signal relative to the input clock signal in the opposite direction responsive to the delay of the delayed clock signal relative to the input clock signal approaching the minimum delay value comprises decreasing one of the counts.

48. The method of claim 45 wherein the steps of increasing and decreasing one of the counts comprise, respectively, increasing and decreasing the initial count.

49. The method of claim 45 wherein the steps of generating the delayed clock signal and adjusting the timing of the delayed clock signal relative to the input clock signal comprise:

generating a plurality of output signals that are increasingly delayed relative to the input clock signal; and selecting one of the output signals as a function of the timing relationship between the delayed clock signal and the digital signal, the selected output signal being used as the delayed clock signal.

50. A method of controlling the operation of a memory device applying read data to a read data register, and controlling a timing that the read data register is enabled to couple the read data through the read data register, comprising:

enabling the read data register responsive to a clock signal, the read data register being enabled at a time relative to the clock signal that is delayed over a relatively narrow range of delay values between a minimum delay value and a maximum delay value;

adjusting the delay value within the range of narrow range of delay values as a function of a timing of the read data being applied to the read data register relative to the timing that the read data register is enabled;

adjusting the timing that the read data is applied to the read data register relative to a timing of the clock signal in one direction responsive to the delay value approaching the minimum delay value; and adjusting the timing that the read data is applied to the read data register relative to the timing of the clock signal in an opposite direction responsive to the delay value approaching the maximum delay value.

51. The method of claim 50, wherein the step of adjusting the delay value comprises adjusting the delay value in delay increments.

52. The method of claim 50 wherein the step of adjusting the timing that the read data is applied to the read data register relative to the timing of the clock signal comprises:

counting from an initial count toward a terminal count; and applying the read data being to the read data register responsive to reaching the terminal count;

increasing one of the counts responsive to the delay value approaching one of the minimum and maximum delay values; and decreasing one of the counts responsive to the delay value approaching the other of the minimum and maximum delay values.

53. The method of claim 52 wherein the steps of increasing and decreasing one of the counts comprise, respectively, increasing and decreasing the initial count.

54. The method of claim 50 wherein the steps of enabling the read data register and adjusting the delay value comprises:

producing a plurality of time values that are increasingly delayed relative to the input clock signal; and selecting one of the time values as a function of the timing of the read data register being enabled relative to the timing of the clock signal;

enabling the read data register at a time corresponding to the selected time value.

* * * * *

UNITED STATES PATENT AND TRADEMARK OFFICE
CERTIFICATE OF CORRECTION

PATENT NO. : 6,101,197  Page 1 of 1
DATED : August 8, 2000
INVENTOR(S) : Brent Keeth and Troy A. Manning It is certified that error appears in the above-identified patent and that said Letters Patent is hereby corrected as shown below:

<u>Title page,</u>
Under U.S. PATENT DOCUMENTS, "5,165,046 ... Hessen" should read -- 5,165,046 ... Hesson --

FOREIGN PATENT DOCUMENTS, "0 704 957 A1" should read -- 0 704 975 A1 --

OTHER PUBLICATIONS,
(Descriptive Literature), Line 2, "Eight Bank, 2.2 V" should read -- Eight Bank, 2.5 V --

OTHER PUBLICATIONS,
(von Kaenel), Line 1, "1.5 mW V CMOS" should read --1.5 mW@V CMOS --

<u>Column 28,</u>
Line 64, "within the range of narrow" should read -- within the narrow --

Signed and Sealed this

Eighteenth Day of December, 2001

Attest:

JAMES E. ROGAN
*Attesting Officer*  *Director of the United States Patent and Trademark Office*